United States Patent
Oniki et al.

(10) Patent No.: US 9,407,801 B2
(45) Date of Patent: Aug. 2, 2016

(54) COMPOUND EYE IMAGE PICKUP APPARATUS

(71) Applicant: CANON KABUSHIKI KAISHA, Tokyo (JP)

(72) Inventors: Takashi Oniki, Utsunomiya (JP); Chiaki Inoue, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/640,361

(22) Filed: Mar. 6, 2015

(65) Prior Publication Data

US 2015/0256745 A1   Sep. 10, 2015

(30) Foreign Application Priority Data

Mar. 7, 2014 (JP) ................................. 2014-045416
Sep. 24, 2014 (JP) ................................. 2014-193605

(51) Int. Cl.
  *H04N 5/225* (2006.01)
  *H01L 27/146* (2006.01)
  *H04N 5/232* (2006.01)
  *H04N 9/04* (2006.01)

(52) U.S. Cl.
  CPC ........ *H04N 5/2254* (2013.01); *H01L 27/14625* (2013.01); *H04N 5/23296* (2013.01); *H04N 9/045* (2013.01)

(58) Field of Classification Search
  CPC . H04N 5/2254; H04N 5/23296; H04N 9/045; H01L 27/14627; H01L 27/14625
  USPC ................................................. 348/335, 340
  See application file for complete search history.

(56) References Cited

U.S. PATENT DOCUMENTS

| 8,345,144 B1* | 1/2013 | Georgiev ............... G03B 11/00 348/335 |
| 2004/0240052 A1 | 12/2004 | Minefuji et al. |
| 2009/0225203 A1* | 9/2009 | Tanida ................. G02B 3/0056 348/262 |
| 2011/0134282 A1* | 6/2011 | Morita ................. G02B 3/0043 348/234 |
| 2014/0002688 A1* | 1/2014 | Inoue ................. H04N 5/23296 348/222.1 |

FOREIGN PATENT DOCUMENTS

| JP | 2003-283907 A | 10/2003 |
| JP | 2005-020718 A | 1/2005 |

* cited by examiner

*Primary Examiner* — Nhan T Tran
*Assistant Examiner* — Chan Nguyen
(74) *Attorney, Agent, or Firm* — Rossi, Kimms & McDowell LLP

(57) ABSTRACT

A compound eye image pickup apparatus includes a plurality of optical systems (1110, 1120, 1130, 1140) including a first optical system having a longest focal length, and an optical system group of a plurality of second optical systems having focal lengths different from the focal length, and includes an image pickup element (1200) including a plurality of image pickup regions corresponding to the plurality of optical systems, and a condition expression below is satisfied, $$\frac{0.15^2 \times S}{p^2 \times P_{AVE}} \le N_t \le \frac{P_{SUM}}{\text{var} \times 2.0 \times 10^6}$$

where p (mm) represents a pixel pitch of the image pickup element, S (mm²) represents an area of the image pickup element, $P_{AVE}$ represents an average value of the number of pixels of each image pickup region, $P_{SUM}$ represents a sum of the number of the pixels of each image pickup region, $N_t$ represents the number of the first optical systems, and var represents the number of the different focal lengths.

14 Claims, 15 Drawing Sheets

COMPOUND EYE IMAGE PICKUP APPARATUS

BACKGROUND OF THE INVENTION

1. Field of the Invention

The present invention particularly relates to a compound eye image pickup apparatus including an array of a plurality of optical systems.

2. Description of the Related Art

A "compound eye" image pickup apparatus has been conventionally known that includes an optical system whose small size is achieved by dividing the optical system into a plurality of optical systems. This "compound eye" has structure of an insect's eye and has a configuration in which, for example, the optical system includes a lens array of a plurality of lens units. The optical system can be downsized by downsizing a diameter of each lens unit and a focal length thereof.

However, it is difficult to provide this compound eye image pickup apparatus with an optical zoom function for varying an image capturing field angle. This is because an optical zoom function that varies the image capturing field angle by moving a lens included in the optical system requires a mechanical move mechanism, which leads to an increase in the size of an image pickup system. To deal with this problem, for example, Japanese Patent Laid-open No. 2005-20718 discloses a configuration in which a short-focus lens unit and a long-focus lens unit that have different field angles are arranged to capture an image including the same part of an object. Specifically, a zoom image obtained by an image pickup element for a long-focus lens is inset in part of a wide image obtained by an image pickup element for a short-focus lens, thereby obtaining an image having a high resolution in the part and a low resolution and a wide field angle in the other part. The configuration includes a single image pickup element and a plurality of optical systems, thereby achieving a thin and small multifocus image pickup device.

Japanese Patent Laid-open No. 2003-283907 discloses a compound eye image pickup apparatus that adds signals of the same part of an object imaged on an image pickup element so as to achieve a high S/N ratio while having an improved resolution with a small pixel size.

However, in the configuration of Japanese Patent Laid-open No. 2005-20718, imaging optical systems have different focal lengths and different focal planes, and thus no imaging optical systems share the same optical property. Thus, signals of the same part of the imaged object cannot be added to improve the S/N ratio, and a sufficient image quality of a reconfigured output image cannot be obtained.

On the other hand, the compound eye image pickup apparatus disclosed in Japanese Patent Laid-open No. 2003-283907 can add signals of the same part of the object and signals of the vicinity thereof that are obtained from each image pickup unit, thereby improving the S/N ratio. However, imaging optical systems arranged in the apparatus have an identical focal length, which results in a degraded resolution of an output image of a field angle different from the field angle of the imaging optical systems.

SUMMARY OF THE INVENTION

The present invention provides a compound eye image pickup apparatus capable of obtaining an output image having a high image quality and a high resolution.

A compound eye image pickup apparatus as one aspect of the present invention includes a plurality of optical systems each including a first optical system having a longest focal length, and an optical system group of a plurality of second optical systems having focal lengths different from the focal length, and includes an image pickup element including a plurality of image pickup regions corresponding to the plurality of optical systems, a conditional expression below is satisfied, $$\frac{0.15^2 \times S}{p^2 \times P_{AVE}} \leq N_t \leq \frac{P_{SUM}}{var \times 2.0 \times 10^6}$$

where p (mm) represents a pixel pitch of the image pickup element, S (mm$^2$) represents an area of the image pickup element, $P_{AVE}$ represents an average value of the number of pixels of each image pickup region, $P_{SUM}$ represents a sum of the number of pixels of each image pickup regions, $N_t$ represents the number of the first optical systems among the plurality of optical systems, and var represents the number of the different focal lengths.

Further features and aspects of the present invention will become apparent from the following description of exemplary embodiments with reference to the attached drawings.

DESCRIPTION OF THE EMBODIMENTS

Exemplary embodiments of the present invention will be described below with reference to the accompanied drawings.

The present invention achieves zooming by, instead of using a typical zoom lens, arranging a plurality of single focus optical systems having different focal lengths to form an image pickup optical system and by using an image pickup element including image pickup regions corresponding to the respective optical systems. First, a configuration to achieve a continuous zoom function of a compound eye image pickup apparatus will be described. A conventional technique achieves simulated zooming (hereinafter, referred to as digital zoom) by cutting a portion of an image captured by an image pickup apparatus and upsizing this cut portion to a predetermined size. The simulated zooming can be achieved by, for example, applying this technique to provide the compound eye image pickup apparatus with imaging optical systems having different field angles and interpolating the different angles of view by the digital zoom technique. With the continuous zoom function, the simulated zooming may upsize the cut portion by providing not only relatively simple processing such as linear interpolation (bilinear interpolation) but also processing such as super-resolution technique to the cut portion so as to generate an image corresponding to an intermediate field angle. This incorporation of the super-resolution technique, which is used for generating a high resolution image, can reduce degradation of resolution due to the digital zoom.

Simply insetting a telephoto image of an image pickup region corresponding to a telephoto lens into part of an image obtained through the digital zoom can yield an image of an intermediate field angle whose resolution is high in the part and low in the other part.

Figure 2A:
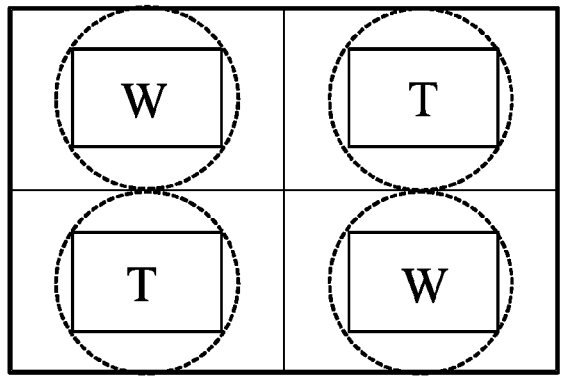
FIGS. 2A to 2C are schematic diagrams of an exemplary arrangement of imaging optical systems in the compound eye image pickup apparatus.
Figure 2B:
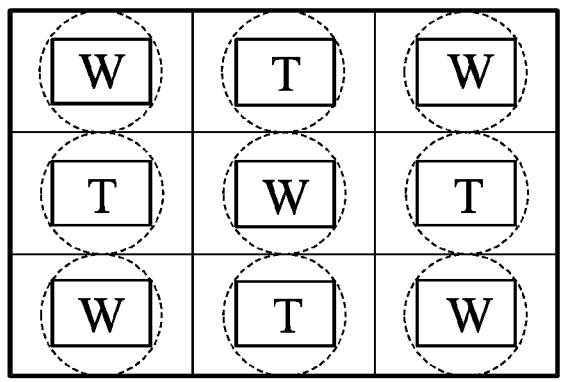
Figure 2C:
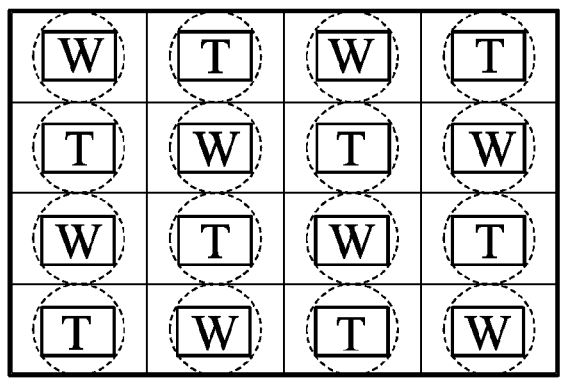

Next, referring to FIGS. 2A to 2C, characteristics of a compound eye image pickup apparatus that includes an image pickup unit including a plurality of imaging optical systems and a single image pickup element will be described. FIGS. 2A to 2C schematically illustrate that the imaging optical systems of the compound eye image pickup apparatus forms images on the image pickup element. With a direction parallel to short sides of the image pickup element being defined to be a longitudinal direction and a direction parallel to long sides thereof being defined to be a horizontal direction, FIG. 2A illustrates a four-eye configuration in which imaging optical systems are arranged in 2 by 2, FIG. 2B illustrates a nine-eye configuration in which imaging optical systems are arranged in 3 by 3, and FIG. 2C illustrates a 16-eye configuration in which imaging optical systems are arranged in 4 by 4. In the present embodiment, the image pickup apparatus illustrated in FIGS. 2A to 2C is a compound eye image pickup apparatus including a plurality of two types of imaging optical systems: an imaging optical system W having a shorter focal length and an imaging optical system T having a longer focal length. In FIGS. 2A to 2C, a dotted circle represents an image circle of each imaging optical system, a solid outer rectangle represents a region of the image pickup element in which an image can be captured, and a solid inscribed rectangle of the image circle represents a facet image pickup region of the imaging optical system. The facet image pickup region is a region where an image signal of an image formed by the imaging optical system is acquired, and is rectangular in this example for the purpose of illustration but may have any shape within the image circle. As illustrated in FIGS. 2A to 2C, the image circles of the imaging optical systems are arranged in touch with each other (i.e. the image circles are circumscribed) in a short-side direction of the image pickup element, areas of the regions of the image pickup element in which images can be captured are equal to each other, and a pixel pitch of the image pickup element is constant. In this case, among three configurations illustrated in FIGS. 2A to 2C, an image circle of the configuration in FIG. 2A having the smallest number of eyes has the largest diameter, whereas an image circle in FIG. 2C of the configuration having the largest number of eyes has the smallest diameter. A larger diameter of an image circle proportionally leads to a larger facet image pickup region, and hence leads to an increased number of pixels in the facet image pickup region for the constant pixel pitch. In contrast, when the facet image pickup region is fixed and the pixel pitch is variable, a smaller pixel pitch leads to an increased number of pixels in the facet image pickup region. Typically, when the imaging optical systems are arranged so that the image circles are close to each other, a smaller number of the imaging optical systems allow larger image circles to be formed, thereby leading to an increased number of pixels in each facet image pickup region.

Next, description will be made of image quality (S/N ratio). With a variable pixel pitch, since a larger opening area of a pixel leads to a larger received light quantity, a larger pixel pitch leads to an improved S/N ratio. Instead of using this configuration, when a plurality of imaging optical systems having an identical focal length are provided being capable of performing simultaneous image capturing as in the present invention, the S/N ratio can be improved by using images captured at identical field angles. The compound eye image pickup apparatus having the configuration in FIG. 2A can acquire two images formed by the imaging optical systems W and two images formed by the imaging optical systems T, and can relatively reduce a noise rate by adding luminance values of these images. The same effect can be obtained with the configurations in FIGS. 2B and 2C, and thus, when the image pickup element has a constant pixel pitch under the same image pickup condition such as an exposure time, the S/N ratio is improved most by the configuration in FIG. 2C that generates the largest number of images to be added together among the three configurations in FIGS. 2A to 2C. Thus, the compound eye image pickup apparatus can have an improved S/N ratio of a final output image by increasing the pixel pitch or the number of imaging optical systems having an identical focal length (the number of identical focal points).

Figures 3A, 3B:
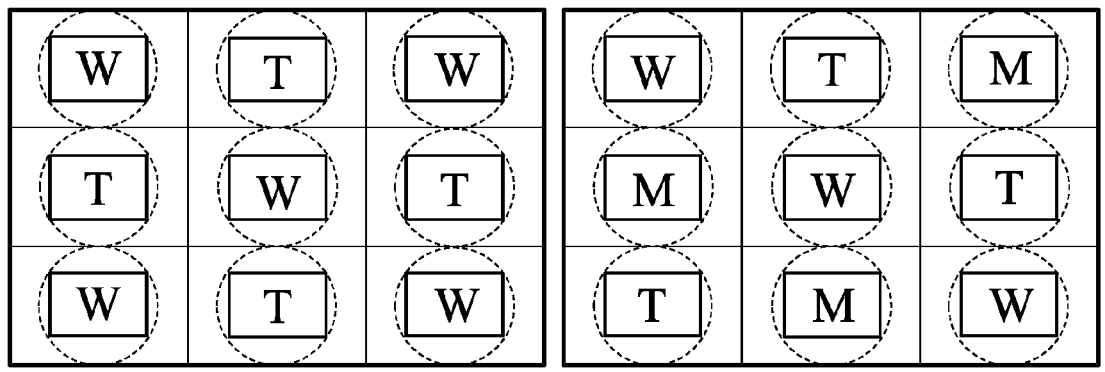
FIGS. 3A and 3B are schematic diagrams of an exemplary nine-eye arrangement of imaging optical systems in the compound eye image pickup apparatus.

Providing the continuous zoom function to the compound eye image pickup apparatus requires an appropriate ratio between imaging optical systems having different focal lengths. When an image at an intermediate field angle is generated through digital zoom, a too large difference degrades the resolution and the image quality since a difference between the focal lengths of imaging optical systems needs to be dealt with the digital zoom. Such degradation can be prevented by adequately reducing the difference between focal lengths of imaging optical systems. Similarly to FIGS. 2A to 2C, FIGS. 3A and 3B schematically illustrate that each imaging optical system of the compound eye image pickup apparatus forms an image on the image pickup element: FIG. 3A illustrates the same configuration as that in FIG. 2B, and FIG. 3B illustrates a configuration additionally including an imaging optical system M having a focal length intermediate between those of the imaging optical systems W and T. It is assumed that when the ratio between imaging optical systems having different focal lengths is, for example, up to two, the continuous zoom function through digital zoom can be achieved while the degradation of the resolution and image quality is reduced. With this ratio, when the imaging optical system W in FIGS. 3A and 3B has a focal length of 28 mm, the configuration in FIG. 3A allows the imaging optical system T to have a focal length of up to 56 mm, and the configuration in FIG. 3B allows the imaging optical system T to have a focal length of up to 84 mm. In this manner, the compound eye image pickup apparatus can have a zoom ratio improved by increasing the number of imaging optical systems having focal lengths different from each other (the number of different focal points). However, with a fixed total number of imaging optical systems as in FIGS. 3A and 3B, increasing the number of different focal points requires reduction of the number of identical focal points. The configuration in FIG. 3A has five imaging optical systems W and four imaging optical systems T, whereas the configuration in FIG. 3B has three imaging optical systems W and three imaging optical systems T, and this difference is reflected on a lowered S/N ratio. With the fixed total number of imaging optical systems as described above, increasing the number of different focal points leads to an improved zoom ratio of the compound eye image pickup apparatus, but simultaneously leads to a lowered S/N ratio in accordance with a reduction in the number of identical focal points. In contrast, increasing the number of identical focal points to improve the S/N ratio leads to a reduction in the number of different focal points and thus leads to a lowered zoom ratio. Thus, improving both zoom ratio and S/N ratio of the compound eye image pickup apparatus requires reviewing the premise that the total number of imaging optical systems is fixed, and the dilemma described above can be solved by increasing the total number of imaging optical systems to increase the number of identical focal points and the number of different focal points. Methods of increasing the total number of imaging optical systems include a method of providing the compound eye image pickup apparatus with the image pickup element having a sufficiently large image pickup region, and, a method of reducing the size of each imaging optical system. The former method allows more imaging optical systems to be arranged by upsizing the image pickup region of the image pickup element while maintaining the size of the imaging optical system, but accordingly increases the size of the compound eye image pickup apparatus. In particular, when two-dimensionally arranged in parallel, the imaging optical systems has a large size in a direction vertical to an imaging plane of the image pickup element, which spoils downsizing that would be otherwise achieved as an advantage of the compound eye image pickup apparatus. On the other hand, the method of reducing the size of each imaging optical system does not cause this increase in the size of the image pickup apparatus but causes reduction in the size of an image circle formed by the imaging optical system in accordance with the reduction in the size of the imaging optical system. This reduction in the size of the image circle decreases the number of pixels in each facet image pickup region as described above, which degrades the resolution of an output image of the image pickup apparatus.

As described above, the image quality (S/N ratio), the number of pixels, the zoom ratio of the compound eye image pickup apparatus, and the size thereof can be expressed in parameters such as the area of the image pickup region and the pixel pitch of the image pickup element, and the number of different focal points and the number of identical focal points of the imaging optical systems. Thus, they cannot be treated independently from one another.

The image quality (S/N ratio), the number of pixels, the zoom ratio of the compound eye image pickup apparatus, and the size thereof need to be balanced to provide a more desirable compound eye image pickup apparatus. One of various balancing methods evaluates the balance by a condition expression (1) below including evaluation values and variables.

$$\frac{0.15^2 \times S}{p^2 \times P_{AVE}} \leq N_t \leq \frac{P_{SUM}}{\text{var} \times 2.0 \times 10^6} \quad (1)$$

In the expression, S represents the area [mm$^2$] of the image pickup region of the image pickup element, p represents the pixel pitch [mm] of the image pickup element, $P_{AVE}$ represents an average value of the numbers of pixels in the facet image pickup regions, $N_t$ represents the number of imaging optical systems having the longest focal length, $P_{SUM}$ represents a sum of the numbers of pixels in the facet image pickup regions, and var represents the number of different focal points. First, the left-hand side of Expression (1) will be described. The left-hand side of Expression (1) is an inequality related to S/N ratio control of the compound eye image pickup apparatus, and can be rewritten as Expression (2) below.

$$0.15 \leq \sqrt{\frac{N_t P_{AVE} p^2}{S}} \quad (2)$$

Since the product of the square of the pixel pitch and the number of pixels corresponds to the area of an image pickup region to be used, the ratio of the average value $P_{AVE}$ of the numbers of pixels in the facet image pickup region to the area S of the image pickup region of the image pickup element in Expression (2) is the reciprocal of the square of a pixel pitch of the image pickup element having the number of pixels $P_{AVE}$. Since a larger number of identical focal points leads to an improved S/N ratio as described above, $N_t$ multiplies the ratio of the square of the pixel pitch p of the image pickup element to the square of the pixel pitch of the image pickup element having the number of pixels $P_{AVE}$.

The right hand side of Expression (2) is expressed in a square root because the square root of shot noise, which is mainly assumed in the present invention, is equal to the number of detected photoelectrons. The left-hand side of Expression (2) is an evaluation value of the S/N ratio and is set to 0.15. This is an empirically calculated value below which the S/N ratio is degraded, and the inequality of Expression (2) needs to be satisfied to provide a compound eye image pickup apparatus capable of outputting an image having a high S/N ratio.

Next, the right hand side of Expression (1) will be described. The right hand side of Expression (1) is an inequality related to the number of pixels of the compound eye image pickup apparatus, and can be rewritten as Expression (3) below.

$$2.0 \times 10^6 \leq \frac{P_{SUM}}{\text{var} \times N_t} \quad (3)$$

The denominator of the right hand side is expressed with the number var of different focal points and the number $N_t$ of imaging optical systems having the longest focal length, and the product thereof is equal to the total number of imaging optical systems when the imaging optical systems have the same number of identical focal points. Although the imaging optical systems do not need to have the same number of identical focal points, a large difference between the numbers of identical focal points is preferably avoided in general because a too large difference between the numbers of identical focal points would degrade the image quality when the compound eye image pickup apparatus performs the continuous zoom.

Thus, the denominator of the right hand side of Expression (3) is ideally equal or close to the total number of imaging optical systems. The numerator of the right hand side of Expression (3) is the sum of the numbers of pixels in the facet image pickup regions, and thus the right hand side of Expression (3) is nearly equal to the number of pixels of each facet image pickup region. The left-hand side of Expression (3) is an evaluation value of the number of pixels and is set to $2.0 \times 10^6$. This is because a full HD resolution, which is used recently as a typical standard for a moving image, is 2.0 M approximately, and thus an image pickup apparatus is required to have a number of pixels of 2.0 M at least. The inequality of Expression (3) needs to be satisfied to provide a compound eye image pickup apparatus having a sufficient number of pixels.

Thus, setting the number $N_t$ of the imaging optical systems having the longest focal length to be within the range of Expression (1), which is derived from Expressions (2) and (3), can provide an appropriately balanced compound eye image pickup apparatus.

Expression (4) below is more preferably satisfied.

$$\frac{0.20^2 \times S}{p^2 \times P_{AVE}} \leq N_t \leq \frac{P_{SUM}}{\text{var} \times 6.7 \times 10^6} \quad (4)$$

Expression (4) is an inequality with evaluation values different from those in Expression (1), and the evaluation value of the S/N ratio in the lower limit of the inequality is increased from 0.15 to 0.2. The S/N ratio is approximately 1.3 times higher than that in Expression (1), and a larger number $N_t$ of imaging optical systems having the longest focal length than the lower limit enables outputting of an image having an improved image quality. On the other hand, the evaluation value of the number of pixels in the upper limit of the inequality is increased from $2.0 \times 10^6$ to $6.7 \times 10^6$, which is approximately a third of 20 M.

With such a resolution of 20 M approximately, the compound eye image pickup apparatus, for which a high resolution is difficult to be obtained as compared to a conventional image pickup apparatus in which an imaging optical system and an image pickup element corresponds to each other, could have a resolution improved up to the resolution level of a latest high-end digital camera. Of various methods of improving the resolution, a method applied to the compound eye image pickup apparatus in the present invention uses a plurality of image data to improve the resolution because a plurality of images at identical field angles can be acquired. When the compound eye image pickup apparatus having the configurations illustrated in FIGS. 2A to 2C and FIGS. 3A and 3B performs image capturing, even imaging optical systems having an identical focal length have disparity due to their position arrangement difference, and thus images obtained in the facet image pickup regions have differences from one another in accordance with the amount of the disparity. There is a method of acquiring a plurality of image data including different position relations between an object image and pixels in the respective images and of synthesizing these images to generate an image having a high resolution, which is typically known as a "pixel shifting" technique. Additionally applying such a technique enables generation of a sharper image having a higher resolution.

In Expressions (1), (2), (3), and (4), the number of imaging optical systems is set to $N_t$ because the number of identical focal points in the present invention is basically the same between imaging optical system groups having different focal lengths or is larger for an imaging optical system group having a shortest focal length. The insetting of a telephoto image in a generated image of an intermediate field angle as described above can increase the resolution at this partial region but not in the other region, that is, not in a region of a wider view angle that is not captured in the telephoto image. The resolution in such a region can be increased by increasing the number of imaging optical systems having the shortest focal length so as to improve the image quality in the region of a wider view angle that is not captured in the telephoto image. In the present invention, in order to maintain the balance of the image quality in a range of a wide angle to a tele angle, the number of identical focal points is the same between the imaging optical systems having different focal lengths or is larger for the imaging optical systems having the shortest focal length.

In other words, when the total number of imaging optical systems is not an integral multiple of the number of different focal lengths (or the number of identical focal points), a number $N_w$ of imaging optical systems having the shortest focal length is set to be larger than the number $N_t$ of imaging optical systems having the longest focal length, thereby achieving a balanced configuration having less variation in the image quality. Thus, the imaging optical systems in the present invention, which include an optical system i having a specific focal length and an optical system h having a focal length longer than the specific focal length, may satisfy a condition expression below Ni≥Nh where Ni represents the number of the optical systems i and Nh represents the number of the optical systems h.

Although imaging optical systems having different focal lengths should basically have the same number of identical focal points to avoid any large difference as described above, this cannot be achieved sometimes due to restrictions such as, for example, the total number of imaging optical systems and an arrangement method. As in the configuration illustrated in FIG. 2B, arranging nine imaging optical systems having two focal lengths of a wide-angle focal length and a telephoto focal length leaves a remainder. In this case, this remainder can be set to be a wide-angle imaging optical system as described above, thereby achieving a more balanced compound eye image pickup apparatus.

Expression (5) is an inequality to evaluate a remainder when imaging optical systems having different focal lengths in the compound eye image pickup apparatus are arranged in trying to have the number of identical focal points.

$$\text{floor}\left(\frac{P_{SUM}}{P_{AVE}} \times \frac{1}{\text{var}}\right) \leq N_w \quad (5)$$

where floor(x) is a floor function that gives a maximum integer not greater than a real number x.

In Expression (5), $N_w$ represents the number of imaging optical systems having the shortest focal length among all imaging optical systems. In y=floor(x), y is the maximum integer not greater than x. In such a configuration of the compound eye image pickup apparatus that this inequality of Expression (5) is satisfied, setting an odd imaging optical system to be an imaging optical system having the shortest focal length facilitates maintaining of the image quality at a region of a wider view angle that is not captured in a telephoto image.

The compound eye image pickup apparatus more preferably satisfies Expression (6) below.

$$\text{floor}\left(\frac{P_{SUM}}{P_{AVE}} \times \frac{1}{\text{var}}\right) \leq N_w \leq \text{floor}\left(\frac{P_{SUM}}{P_{AVE}} \times \frac{1}{\text{var}} + 1\right) \quad (6)$$

Satisfying Expression (6) ensures that the numbers of identical focal points are more uniformly set for groups of imaging optical systems, thereby achieving a more balanced compound eye image pickup apparatus.

Exemplary embodiments of the present invention will be described below with reference to the accompanied drawings.

Embodiment 1

Figure 1:
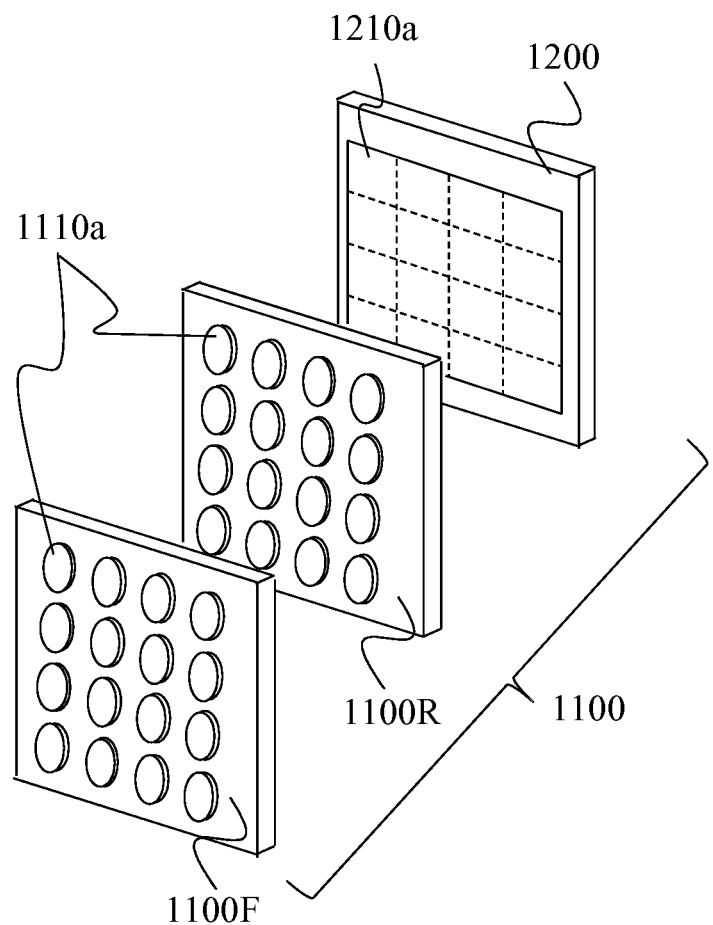
FIG. 1 is a perspective diagram of an image pickup unit of a compound eye image pickup apparatus according to Embodiment 1 of the present invention.
Figure 4:
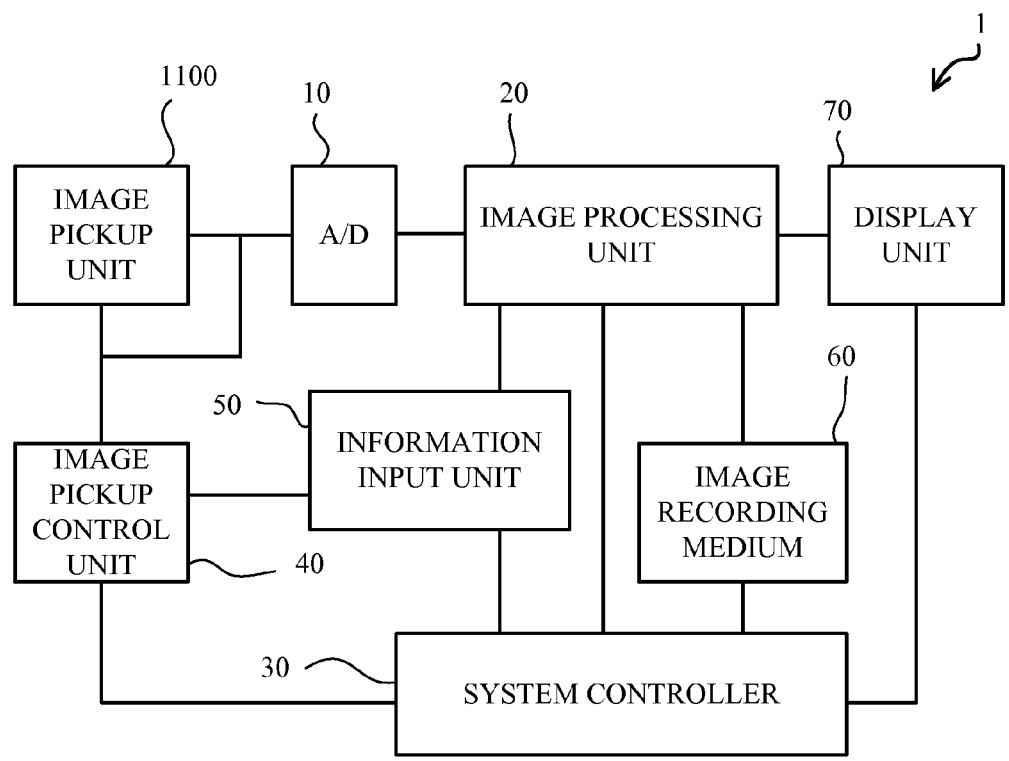
FIG. 4 is a block diagram of a compound eye image pickup apparatus according to Embodiment 1 of the present invention.
Figure 5:
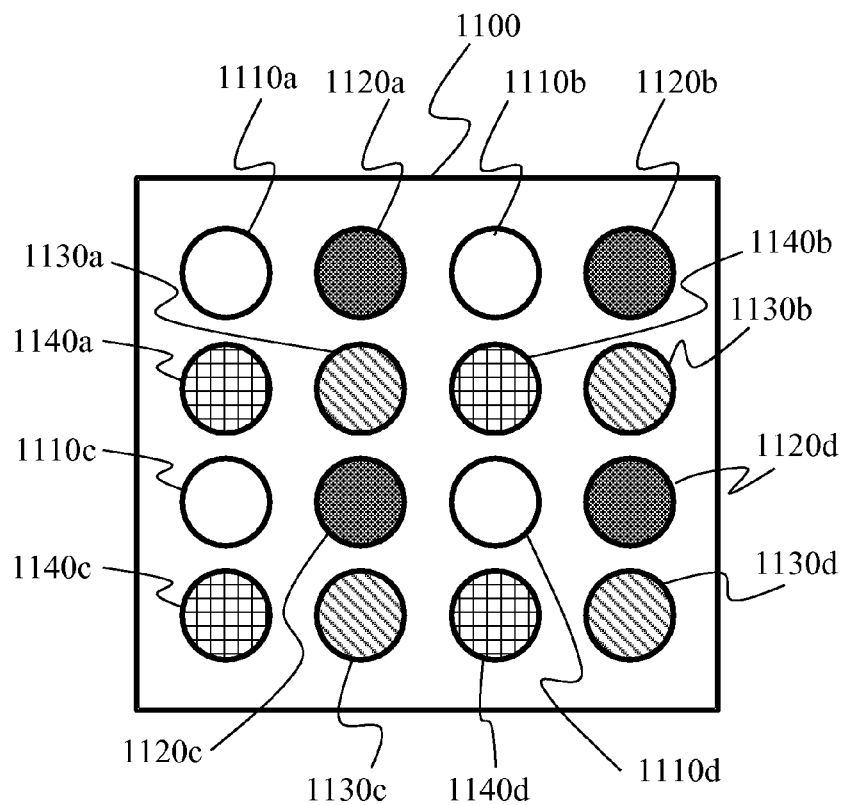
FIG. 5 is a front view of the image pickup unit according to Embodiment 1 of the present invention.
Figure 20:
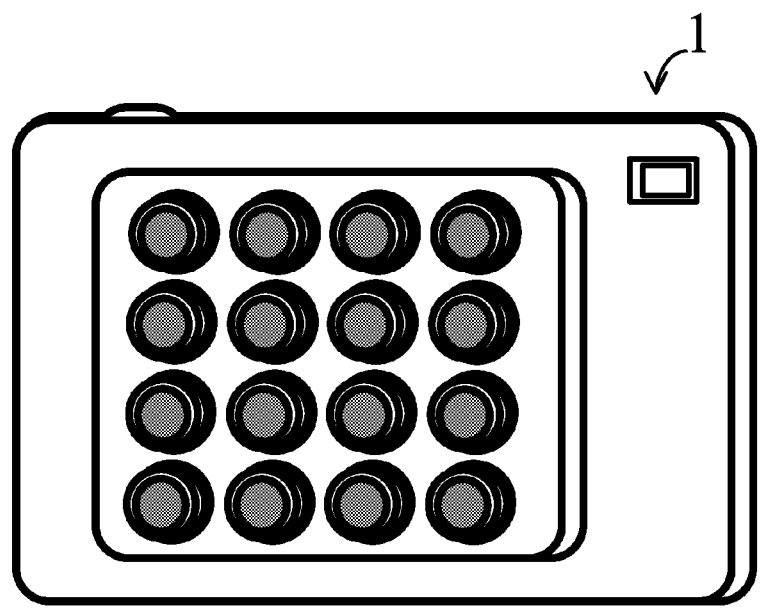
FIG. 20 is an exterior diagram of a compound eye image pickup apparatus according to each embodiment of the present invention.

FIG. 4 is a block diagram of a compound eye image pickup apparatus 1 in the present embodiment, FIG. 1 is a perspective diagram of an image pickup unit 1100 of the compound eye image pickup apparatus 1, and FIG. 5 is a front view of the image pickup unit 1100. FIG. 20 is a schematic diagram of the exterior of the compound eye image pickup apparatus 1.

The compound eye image pickup apparatus 1 includes the image pickup unit 1100, an A/D converter 10, an image processing unit 20, a system controller 30, an image pickup control unit 40, an information input unit 50, an image recording medium 60, and a display unit 70. The compound eye image pickup apparatus 1 may be a lens-integrated image pickup apparatus or may include a lens apparatus including an imaging optical system (image pickup optical system) and an image pickup apparatus body onto which the lens apparatus is detachably mounted and that includes an image pickup element.

As illustrated in FIGS. 1 and 5, the image pickup unit 1100 includes 16 imaging optical systems (image pickup optical systems) 1110a, 1110b, 1110c, and 1110d; 1120a, 1120b, 1120c, and 1120d; 1130a, 1130b, 1130c, and 1130d; 1140a, 1140b, 1140c, and 1140d that each form an optical image of an object, and an image pickup element 1200. Each imaging optical system includes a front unit 1100F and a rear unit 1100R, and other members such as an aperture stop (not illustrated). The number of lenses mounted on the front unit 1100F and the rear unit 1100R of the imaging optical system is one or more.

Figure 7:
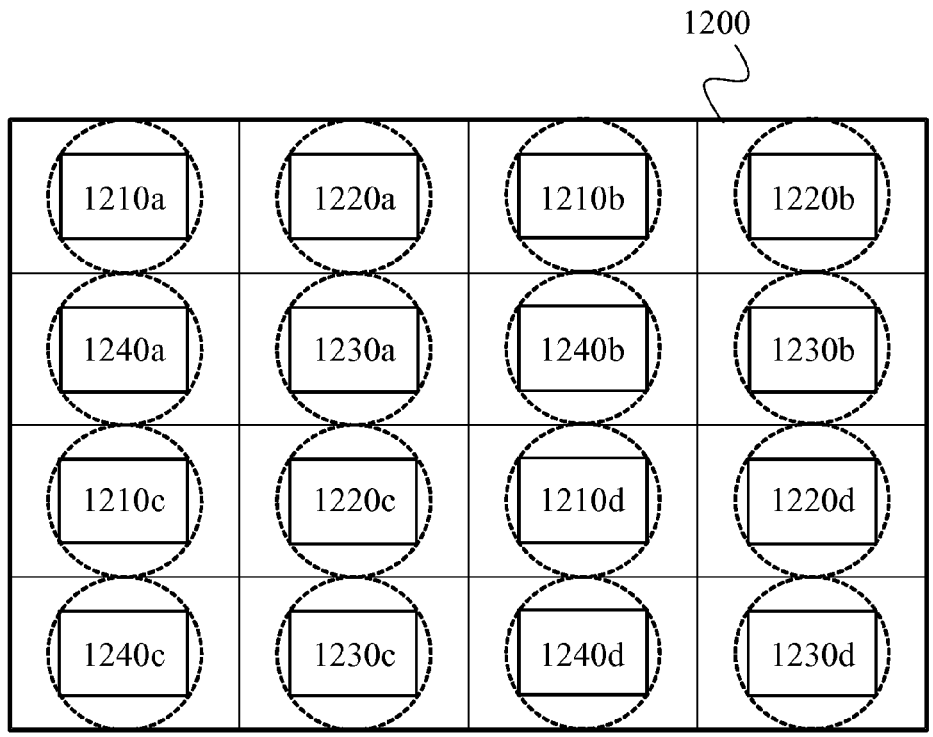
FIG. 7 is a relational diagram of the imaging optical systems and image pickup regions according to Embodiment 1 of the present invention.

The image pickup element 1200 includes 16 partitioned facet image pickup regions 1210a, 1210b, 1210c, and 1210d; 1220a, 1220b, 1220c, and 1220d; 1230a, 1230b, 1230c, and 1230d; and 1240a, 1240b, 1240c, and 1240d as illustrated in FIG. 7.

The facet image pickup regions 1210a, 1210b, 1210c, and 1210d respectively correspond to the imaging optical systems 1110a, 1110b, 1110c, and 1110d. The facet image pickup regions 1220a, 1220b, 1220c, and 1220d respectively correspond to the imaging optical systems 1120a, 1120b, 1120c, and 1120d. The facet image pickup regions 1230a, 1230b, 1230c, and 1230d respectively correspond to the imaging optical systems 1130a, 1130b, 1130c, and 1130d. The facet image pickup regions 1240a, 1240b, 1240c, and 1240d respectively correspond to the imaging optical systems 1140a, 1140b, 1140c, and 1140d.

As illustrated in FIG. 5, optical axes of the imaging optical systems (facet) 1110a to 1110d, 1120a to 1120d, 1130a to 1130d, and 1140a to 1140d are arranged substantially parallel to one another. The four imaging optical systems a, b, c, and d (optical system group) labeled with an identical reference number have an identical focal length, and the imaging optical systems labeled with different reference numbers (1110, 1120, 1130, and 1140) have focal lengths different from one another. In the present embodiment, four sets of imaging optical systems having different focal lengths are provided. The imaging optical systems (second optical systems) 1110a, 1110b, 1110c, and 1110d (wide facets) are a set of wide-angle imaging optical systems having a shortest focal length among the 16 imaging optical systems. The imaging optical systems 1120a, 1120b, 1120c, and 1120d (wide-middle facets) have focal lengths longer than those of the imaging optical systems 1110a, 1110b, 1110c, and 1110d. The imaging optical systems 1130a, 1130b, 1130c, and 1130d (tele-middle facet) have focal lengths longer than the imaging optical systems 1120a, 1120b, 1120c, and 1120d. The imaging optical systems (first optical systems) 1140a, 1140b, 1140c, and 1140d (tele facets) have focal lengths longer than those of the imaging optical systems 1130a, 1130b, 1130c, and 1130d, and are a set of telephoto imaging optical systems having a longest focal length among the 16 imaging optical systems.

Figure 6:
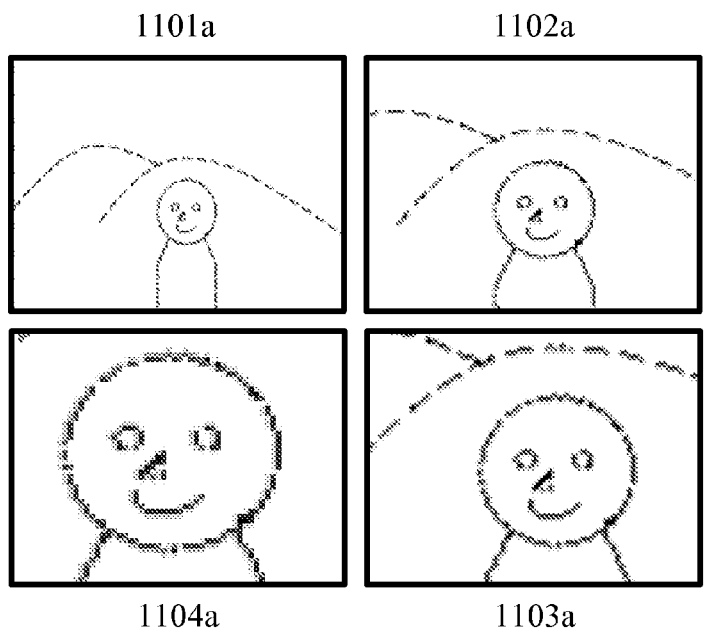
FIG. 6 is an exemplary image captured by each imaging optical system according to Embodiment 1 of the present invention.

FIG. 6 illustrates captured images 1101a, 1102a, 1103a, and 1104a corresponding to the imaging optical systems 1110a, 1120a, 1130a, and 1140a. As illustrated in FIG. 6, the captured image 1101a corresponding to the imaging optical system 1110a has a largest object space. Similarly, the captured images 1102a, 1103a, and 1104a corresponding to the imaging optical systems 1120a, 1130a, and 1140a have smaller object spaces depending on focal lengths.

Referring to FIG. 4, a configuration of the compound eye image pickup apparatus 1 of the present invention will be described.

The 16 imaging optical systems in FIG. 5 included in the image pickup unit 1100 constitute a set of compound eyes, and the 16 partitioned facet image pickup regions of the image pickup element 1200 convert optical images reached at a surface of the image pickup element through the respective imaging optical systems into electric signals (analog signals).

The A/D converter 10 converts the analog signals output from the facet image pickup regions of the image pickup element 1200 included in the image pickup unit 1100 into digital signals, and supplies the digital signals to the image processing unit 20.

The image processing unit 20 provides image data from the A/D converter 10 with, for example, predetermined pixel interpolation processing and color conversion processing, and predetermined calculation processing based on captured image data. Results of the processing by the image processing unit 20 are transmitted to the system controller 30.

The information input unit 50 acquires, through an information acquisition unit (not illustrated), input information of a desired image capturing condition selected by a user and supplies its data to the system controller 30. The system controller 30 controls the image pickup control unit 40 based on transmitted data, and controls the image pickup element in accordance with a focus moving amount, an aperture value of each imaging optical system, and an exposure time so as to acquire a required image.

The image recording medium 60 stores a plurality of still images and moving images, and a file header to generate an image file. The display unit 70 displays, for example, an image, a status, and a malfunction, and includes a liquid crystal display element.

Next, referring to FIG. 7, a detailed configuration of the image pickup unit 1100 in the present embodiment will be described.

FIG. 7 is a schematic diagram of the image pickup element 1200 in the image pickup unit. A solid outer rectangle represents the image pickup element, which has a long side of 36 mm, a short side of 24 mm, and a pixel pitch of 1.2 μm. In FIG. 7, a dotted circle represents an image circle of an imaging optical system, and a solid inscribed rectangle of the image circle represents a facet image pickup region. In the present embodiment, the image circles of the imaging optical systems are arranged in touch with each other (i.e. the image circles are circumscribed with each other) in the short-side direction, and each have a diameter of 6.00 mm approximately because the short side of the image pickup element has a length of 24 mm. In other words, the optical systems are arranged such that the image circles thereof are in touch with each other along at least one of sides of the image pickup element 1200 that are orthogonal to each other.

Next, the inscribed facet image pickup region of the image circle of each imaging optical system will be described. The facet image pickup region can be set anywhere in the image circle as described above and can have an individual size, But is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The long sides of the facet image pickup region are each 4.99 mm approximately, and the short sides thereof are each 3.33 mm approximately, and thus the ratio of the short and long sides is 2:3 as with the image pickup element. Setting the facet image pickup region in this manner allows its approximate number of pixels to be estimated, based on its area ratio relative to the image pickup element, to be 11.54 million pixels approximately in the present embodiment.

A group Grw of imaging optical systems having a shortest focal length in the present embodiment includes the imaging optical systems 1110a, 1110b, 1110c, and 1110d illustrated in FIG. 5, and the number $N_w$ of imaging optical systems is four. A group Grt of imaging optical systems having a longest focal length in the present embodiment includes the imaging optical systems 1140a, 1140b, 1140c, and 1140d illustrated in FIG. 5, and the number $N_t$ of imaging optical systems is four.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limits of Expressions (1) and (4), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limits of Expressions (1) and (4), which indicates that the compound eye image pickup apparatus is capable of outputting an image having a sufficient number of pixels.

The inequalities of Expressions (5) and (6) are satisfied because imaging optical systems having different focal lengths in the present embodiment have the same number of identical focal points.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal points compound eye image pickup apparatus capable of outputting an image having a high image quality and a high resolution. In other words, the present invention can optimize the sizes, the total number, and the ratio of the number of different focal points and the number of identical focal points of the facets appropriately for the size of the image pickup element, thereby providing a small different focal point compound eye image pickup apparatus capable of outputting an image having a high image quality and a high resolution.

The configuration of the present invention allows an image pickup apparatus such as a video camera and a digital camera to be developed into a thin image pickup apparatus that has a high magnification ratio and is capable of easily acquiring space information of an object space whose image is to be captured.

Embodiment 2

Figure 8:
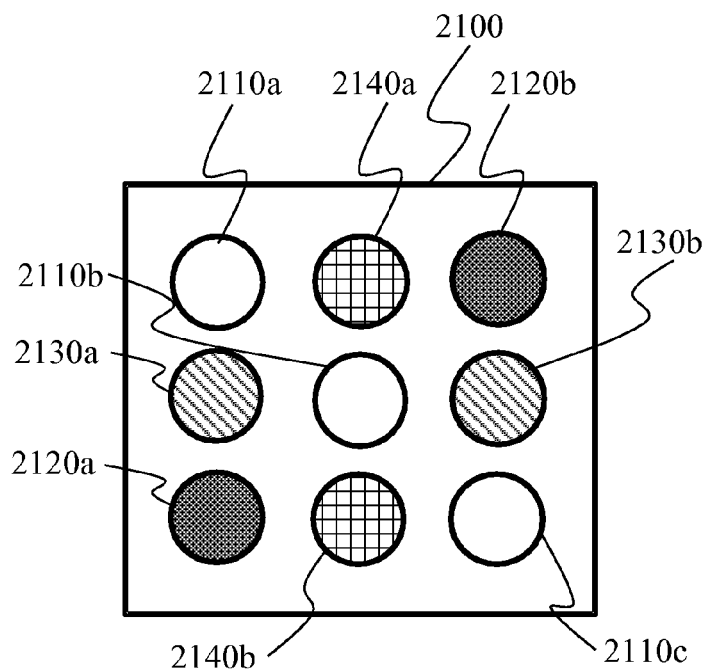
FIG. 8 is a front view of an image pickup unit according to Embodiment 2 of the present invention.

A compound eye image pickup apparatus in the present embodiment has the same configuration as that of Embodiment 1 except for configurations of imaging optical systems and an image pickup element 2200 of an image pickup unit 2100, and thus description will be made of the imaging optical systems and the image pickup element 2200. FIG. 8 is a front view of the image pickup unit 2100.

The compound eye image pickup apparatus includes nine imaging optical systems (image pickup optical systems) 2110a, 2110b, and 2110c; 2120a and 2120b; 2130a and 2130b; and 2140a and 2140b that each forms an optical image of an object, and the image pickup element 2200.

Each imaging optical system includes other members such as an aperture stop (not illustrated). The imaging optical system includes a plurality of lenses.

The image pickup element 2200 includes nine partitioned facet image pickup regions 2210a, 2210b, and 2210c; 2220a and 2220b; 2230a and 2230b; and 2240a and 2240b.

The facet image pickup regions 2210a, 2210b, and 2210c respectively correspond to the imaging optical systems 2110a, 2110b, and 2110c, and the facet image pickup regions 2220a and 2220b respectively correspond to the imaging optical systems 2120a and 2120b. The facet image pickup regions 2230a and 2230b respectively correspond to the imaging optical systems 2130a and 2130b, and the facet image pickup regions 2240a and 2240b respectively correspond to the imaging optical systems 2140a and 2140b.

Similarly to Embodiment 1, optical axes of the nine imaging optical systems (image pickup optical systems) 2110a, 2110b, and 2110c; 2120a and 2120b; 2130a and 2130b; and 2140a and 2140b are arranged substantially parallel to one another. The imaging optical systems labeled with an identical reference number (a, b, and c, or a and b) have an identical focal length, the imaging optical systems labeled with different reference numbers (2110, 2120, 2130, and 2140) have focal lengths different from one another. In the present embodiment, four sets of imaging optical systems having different focal lengths are provided. The imaging optical systems 2110a, 2110b, and 2110c (wide facets) are a set of wide-angle imaging optical systems having a shortest focal length among the nine imaging optical systems. The imaging optical systems 2120a and 2120b (wide-middle facets) have focal lengths longer than those of the imaging optical systems 2110a and 2110b. The imaging optical systems 2130a and 2130b (tele-middle facets) have focal lengths longer than those of the imaging optical systems 2120a and 2120b. The imaging optical systems 2140a and 2140b (tele facets) have focal lengths longer than those of the imaging optical systems 2130a and 2130b, and are a set of telephoto imaging optical systems having a longest focal length the nine imaging optical systems.

Next, referring to FIG. 9, a detailed configuration of the image pickup unit 2100 in the present embodiment will be described.

Figure 9:
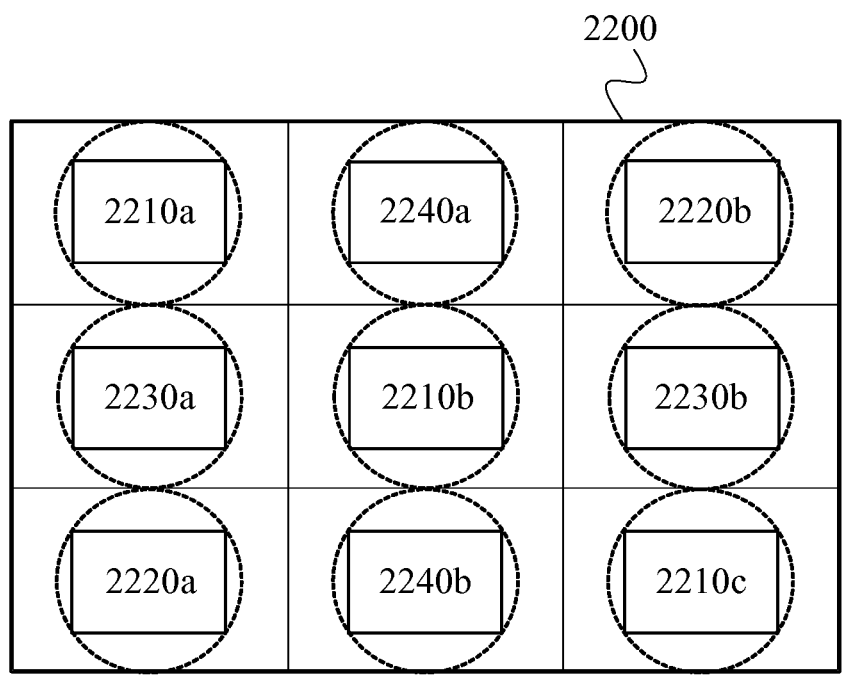
FIG. 9 is a relational diagram of imaging optical systems and image pickup regions according to Embodiment 2 of the present invention.

FIG. 9 is a schematic diagram of the image pickup element 2200 in the image pickup unit. A solid outer rectangle represents the image pickup element, which has a long side of 22.3 mm, a short side of 14.9 mm, and a pixel pitch of 1.2 μm. In FIG. 9, a dotted circle represents an image circle of an imaging optical system, and a solid inscribed rectangle of the image circle represents a facet image pickup region. In the present embodiment, the image circles of the imaging optical systems are arranged in touch with each other in the short-side direction, and each have a diameter of 4.96 mm approximately because the short side of the image pickup element has a length of 14.9 mm. In other words, the optical systems are arranged such that the image circles thereof are in touch with each other along at least one of sides of the image pickup element 2200 that are orthogonal to each other.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The long sides of the facet image pickup region are each 4.13 mm approximately, and the short sides thereof are each 2.75 mm approximately, and thus the ratio of the short and long sides is 2:3 as with the image pickup element. Setting the facet image pickup region in this manner allows its approximate number of pixels to be estimated, based on its area ratio relative to the image pickup element, to be 7.89 million pixels approximately in the present embodiment.

The group Grw of imaging optical systems having a shortest focal length in the present embodiment includes the imaging optical systems 2110a, 2110b, and 2110c illustrated in FIG. 8, and the number $N_w$ of the imaging optical systems is three. The group Grt of imaging optical systems having a longest focal length in the present embodiment includes the imaging optical systems 2140a and 2140b illustrated in FIG. 8, and the number $N_t$ of the imaging optical systems is two.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of the imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limits of Expressions (1) and (4), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limits of Expressions (1) and (4), which indicates that the compound eye image pickup apparatus is capable of outputting an image having a sufficient number of pixels.

The inequalities of Expressions (5) and (6) are satisfied because imaging optical systems having different focal lengths in the present embodiment have a larger number of identical focal points for wide facets than those for tele facets.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal point compound eye image pickup apparatus capable of outputting an image having a high image quality and a high resolution. In other words, the present invention can optimize the sizes, the total number, and the ratio of the number of different focal points and the number of identical focal points of the facets in accordance with the size of the image pickup element, thereby providing a different focal point compound eye image pickup apparatus that is small and capable of outputting an image having a high image quality and a high resolution.

The configuration of the present invention allows an image pickup apparatus such as a video camera and a digital camera to be developed into a thin image pickup apparatus that has a high magnification ratio and is capable of easily acquiring space information of an object space whose image is to be captured.

Embodiment 3

Figure 10:
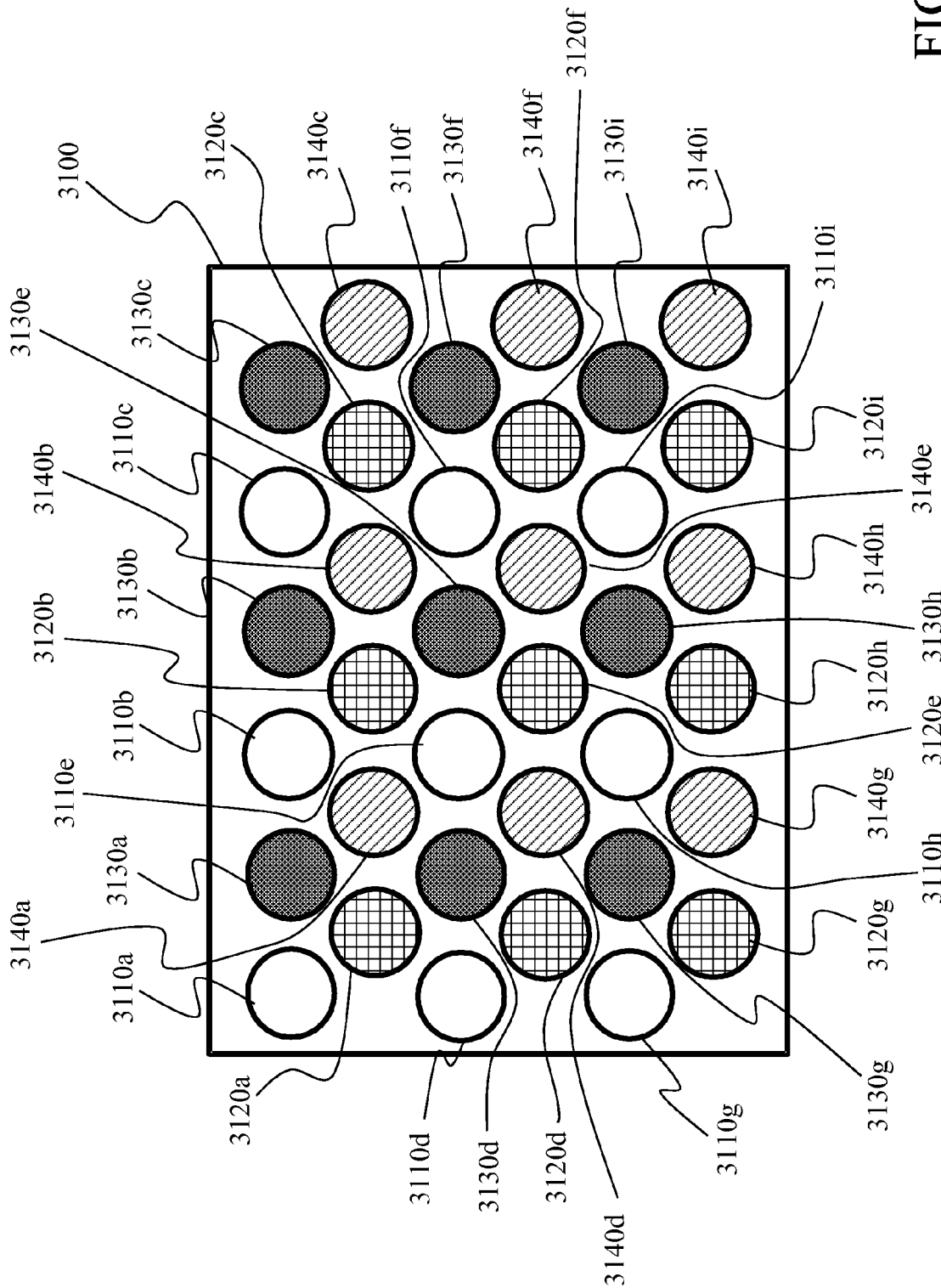
FIG. 10 is a front view of an image pickup unit according to Embodiment 3 of the present invention.

A compound eye image pickup apparatus in the present embodiment has the same configuration as that of Embodiment 1 except for configurations of imaging optical systems and an image pickup element 3200 of an image pickup unit 3100, and thus description will be made of the imaging optical systems and the image pickup element 3200. FIG. 10 is a front view of the image pickup unit 3100.

The compound eye image pickup apparatus includes 36 imaging optical systems (image pickup optical systems) that each forms an optical image of an object, and the image pickup element 3200. The 36 imaging optical systems are imaging optical systems 3110a, 3110b, 3110c, 3110d, 3110e, 3110f, 3110g, 3110h, and 3110i; 3120a, 3120b, 3120c, 3120d, 3120e, 3120f, 3120g, 3120h, and 3120i; 3130a, 3130b, 3130c, 3130d, 3130e, 3130f, 3130g, 3130h, and 3130i; and 3140a, 3140b, 3140c, 3140d, 3140e, 3140f, 3140g, 3140h, and 3140i.

Each imaging optical system includes other members such as an aperture stop (not illustrated). The imaging optical system includes a plurality of lenses.

The image pickup element 3200 includes 36 partitioned facet image pickup regions 3210a, 3210b, 3210c, 3210d, 3210e, 3210f, 3210g, 3210h, and 3210i; 3220a, 3220b, 3220c, 3220d, 3220e, 3220f, 3220g, 3220h, and 3220i; 3230a, 3230b, 3230c, 3230d, 3230e, 3230f, 3230g, 3230h, and 3230i; and 3240a, 3240b, 3240c, 3240d, 3240e, 3240f, 3240g, 3240h, and 3240i.

The facet image pickup regions 3210a, 3210b, 3210c, 3210d, 3210e, 3210f, 3210g, 3210h, and 3210i respectively correspond to the imaging optical systems 3110a, 3110b, 3110c, 3110d, 3110e, 3110f, 3110g, 3110h, and 3110i. The facet image pickup regions 3220a, 3220b, 3220c, 3220d, 3220e, 3220f, 3220g, 3220h, and 3220i respectively correspond to the imaging optical systems 3120a, 3120b, 3120c, 3120d, 3120e, 3120f, 3120g, 3120h, and 3120i. The facet image pickup regions 3230a, 3230b, 3230c, 3230d, 3230e, 3230f, 3230g, 3230h, and 3230i respectively correspond to the imaging optical systems 3130a, 3130b, 3130c, 3130d, 3130e, 3130f, 3130g, 3130h, and 3130i. The facet image pickup regions 3240a, 3240b, 3240c, 3240d, 3240e, 3240f, 3240g, 3240h, and 3240i respectively correspond to the imaging optical systems 3140a, 3140b, 3140c, 3140d, 3140e, 3140f, 3140g, 3140h, and 3140i.

Similarly to Embodiment 1, optical axes of the 36 imaging optical systems (image pickup optical systems) 3110a to 3110i, 3120a to 3120i, 3130a to 3130i, and 3140a to 3140i are arranged substantially parallel to one another. The nine imaging optical systems a, b, c, d, e, f, g, h, and i labeled with an identical reference number have an identical focal length, and the imaging optical systems labeled with different reference numbers (3110, 3120, 3130, and 3140) have focal lengths different from one another. In the present embodiment, four sets of imaging optical systems having different focal lengths are provided. The imaging optical systems 3110a to 3110i (wide facets) are a set of wide-angle imaging optical systems having a shortest focal length among the 36 imaging optical systems. The imaging optical systems 3120a to 3120i (wide-middle facets) have focal lengths longer than those of the imaging optical systems 3110a to 3110i. The imaging optical systems 3130a to 3130i (tele-middle facets) have focal lengths longer than those of the imaging optical systems 3120a to 3120i. The imaging optical systems 3140a to 3140i (tele facets) have focal lengths longer than those of the imaging optical systems 3130a to 3130i, and are a set of telephoto imaging optical systems having a longest focal length among the 36 imaging optical systems.

Next, referring to FIG. 11, a detailed configuration of the image pickup unit 3100 in the present embodiment will be described.

Figure 11:
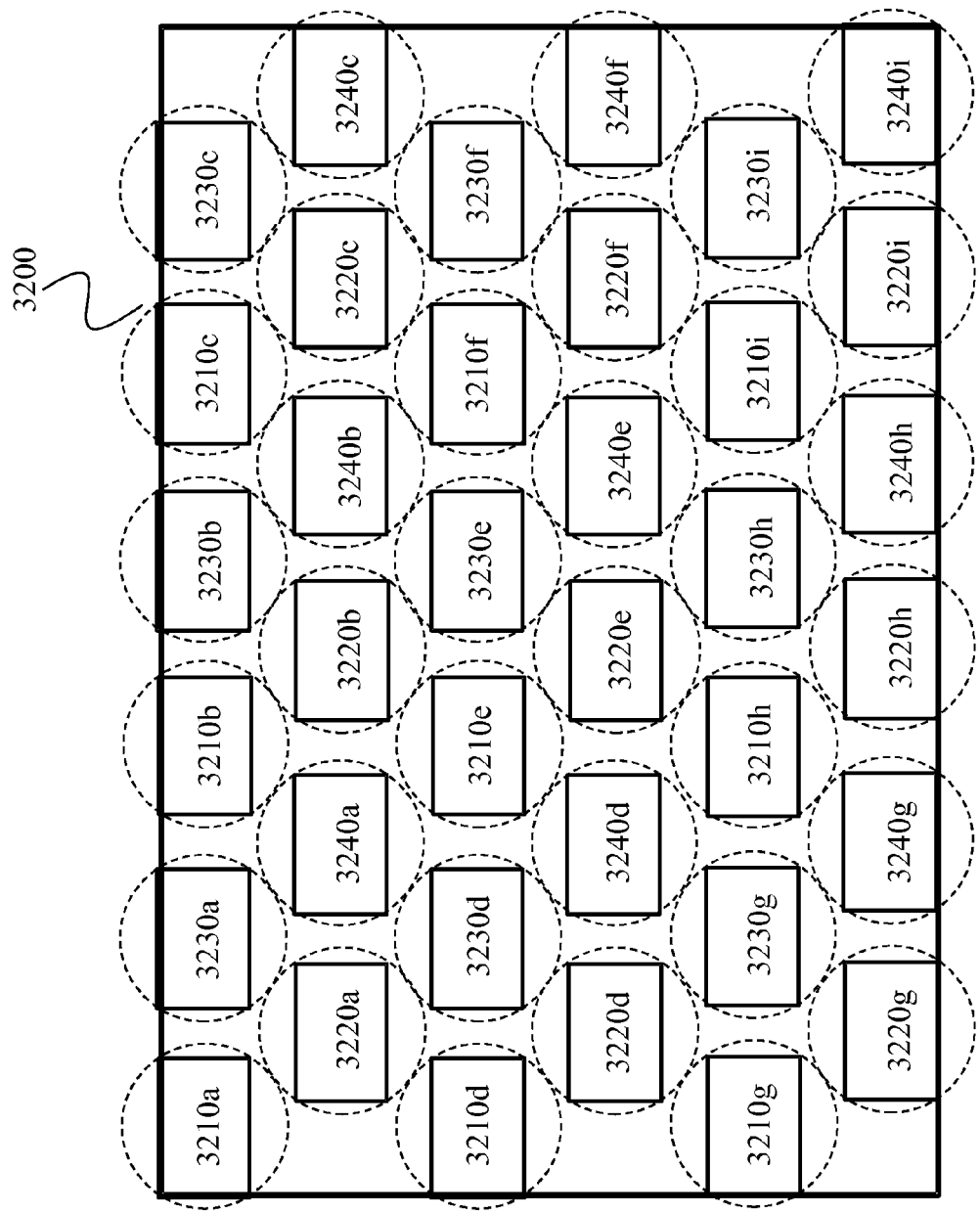
FIG. 11 is a relational diagram of imaging optical systems and image pickup regions according to Embodiment 3 of the present invention.

FIG. 11 is a schematic diagram of the image pickup element 3200 in the image pickup unit. A solid outer rectangle represents the image pickup element, which has a long side of 36 mm, a short side of 24 mm, and a pixel pitch of 1.2 μm. In FIG. 11, a dotted circle represents an image circle of an imaging optical system, and a solid inscribed rectangle of the image circle represents a facet image pickup region. In the present embodiment, the imaging optical systems are arranged at positions shifted from those in a lattice arrangement so as to maximize areas of the 36 partitioned facet image pickup regions. In the present embodiment, adjacent image circles of the imaging optical systems are in touch with each other, and a line connecting centers of image circles of imaging optical systems labeled with an identical reference number is a straight line parallel to the short sides.

The image circles in the present embodiment each have a diameter of 5.12 mm approximately.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The long sides of the facet image pickup region are each 4.26 mm approximately, and the short sides thereof are each 2.84 mm approximately, and thus the ratio of the short and long sides is 2:3 as with the image pickup element. Setting the facet image pickup region in this manner allows its approximate number of pixels to be estimated, based on its area ratio relative to the image pickup element, to be 8.4 million pixels approximately in the present embodiment.

The group Grw of imaging optical systems having a shortest focal length in the present embodiment includes the imaging optical systems 3110a, 3110b, 3110c, 3110d, 3110e, 3110f, 3110g, 3110h, and 3110i illustrated in FIG. 10, and the number $N_w$ of the imaging optical systems is nine. The group Grt of imaging optical systems having a longest focal length in the present embodiment includes the imaging optical systems 3140a, 3140b, 3140c, 3140d, 3140e, 3140f, 3140g, 3140h, and 3140i illustrated in FIG. 10, and the number $N_t$ of the imaging optical systems is nine.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of the imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limits of Expressions (1) and (4), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limits of Expressions (1) and (4), which indicates that the compound eye image pickup apparatus is capable of outputting an image having a sufficient number of pixels.

The inequalities of Expressions (5) and (6) are satisfied because imaging optical systems having different focal lengths in the present embodiment have the same number of identical focal points.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal point compound eye image pickup apparatus capable of outputting an image having a high image quality and a high resolution. In other words, the present invention can optimize the sizes, the total number, and the ratio of the number of different focal points and the number of identical focal points of the facets in accordance with the size of the image pickup element, thereby providing a different focal point compound eye image pickup apparatus that is small and capable of outputting an image having a high image quality and a high resolution.

The configuration of the present invention allows an image pickup apparatus such as a video camera and a digital camera to be developed into a thin image pickup apparatus that has a high magnification ratio and is capable of easily acquiring space information of an object space whose image is to be captured.

Embodiment 4

Figure 12:
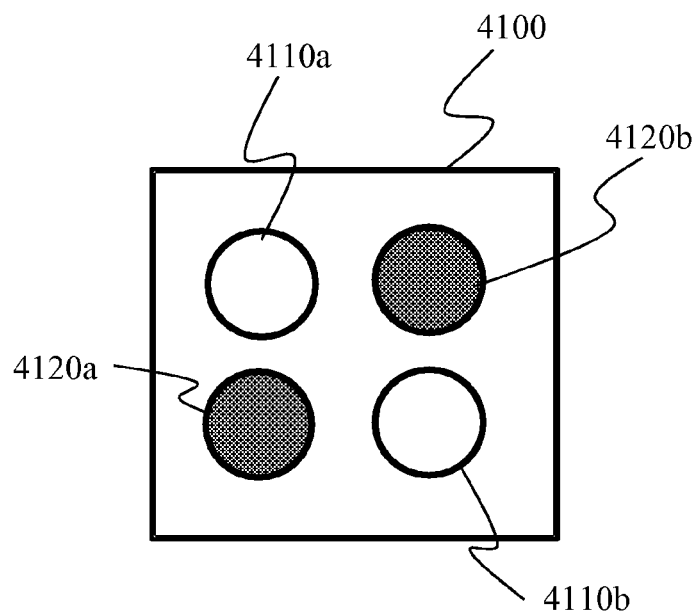
FIG. 12 is a front view of an image pickup unit according to Embodiment 4 of the present invention.

A compound eye image pickup apparatus in the present embodiment has the same configuration as that of Embodiment 1 except for configurations of imaging optical systems and an image pickup element 4200 of an image pickup unit 4100, and thus description will be made of the imaging optical systems and the image pickup element 4200. FIG. 12 is a front view of the image pickup unit 4100.

The compound eye image pickup apparatus includes four imaging optical systems (image pickup optical systems) 4110a, 4110b, 4120a, and 4120b and the image pickup element 4200 that each forms an optical image of an object.

Each imaging optical system includes other members such as an aperture stop (not illustrated). The imaging optical system includes a plurality of lenses.

The image pickup element 4200 includes the four partitioned facet image pickup regions 4210a, 4210b, 4220a, and 4220b.

The facet image pickup regions 4210a and 4210b respectively correspond to the imaging optical systems 4110a and 4110b, and the facet image pickup regions 4220a and 4220b respectively correspond to the imaging optical systems 4120a and 4120b.

Similarly to Embodiment 1, optical axes of the four imaging optical systems (image pickup optical systems) 4110a, 4110b, 4120a, and 4120b are arranged substantially parallel to one another. The two imaging optical systems a and b labeled with an identical reference number have an identical focal length, and the imaging optical systems labeled with different reference numbers (4110 and 4120) have focal lengths different from one another. In the present embodiment, two sets of imaging optical systems having different focal lengths are provided. The imaging optical systems 4110a and 4110b (wide facets) are a set of wide-angle imaging optical systems having focal lengths shorter than those of the imaging optical systems 4120a and 4120b. In contrast, the imaging optical systems 4120a and 4120b (tele facets) are a set of telephoto imaging optical systems having focal lengths longer than those of the imaging optical systems 4110a and 4110b.

Next, referring to FIG. 13, a detailed configuration of the image pickup unit 4100 in the present embodiment will be described.

Figure 13:
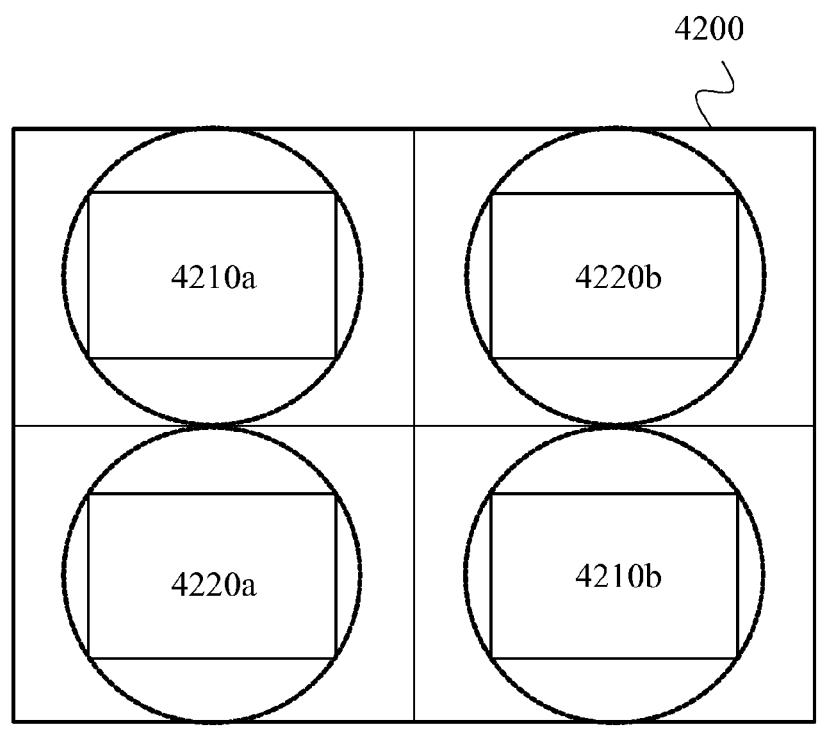
FIG. 13 is a relational diagram of imaging optical systems and image pickup regions according to Embodiment 4 of the present invention.

FIG. 13 is a schematic diagram of the image pickup element 4200 in the image pickup unit. A solid outer rectangle represents the image pickup element, which has a long side of 6.4 mm, a short side of 4.6 mm, and a pixel pitch of 1.0 μm. In FIG. 13, a dotted circle represents an image circle of an imaging optical system, and a solid inscribed rectangle of the image circle represents the facet image pickup region. In the present embodiment, the image circles of the imaging optical systems are arranged in touch with each other in the short-side direction, and each have a diameter of 2.3 mm approximately because the short side of the image pickup element has a length of 4.6 mm. In other words, the optical systems are arranged such that the image circles thereof are in touch with each other along at least one of sides of the image pickup element 4200 that are orthogonal to each other.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The facet image pickup region has a long side of 1.91 mm approximately and a short side of 1.28 mm approximately, and thus the ratio of the short and long sides is 2:3. Setting the facet image pickup region in this manner allows its approximate number of pixels to be estimated, based on its area ratio relative to the image pickup element, to be 2.44 million pixels approximately in the present embodiment.

The group Grw of imaging optical systems having a shortest focal length in the present embodiment includes the imaging optical systems 4110a and 4110b illustrated in FIG. 12, and the number $N_w$ of the imaging optical systems is two. The group Grt of imaging optical systems having a longest focal length in the present embodiment includes the imaging optical systems 4120a and 4120b illustrated in FIG. 12, and the number $N_t$ of the imaging optical systems is two.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of the imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limits of Expressions (1) and (4), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limit of Expression (1), which indicates that the compound eye image pickup apparatus is capable of outputting an image having a sufficient number of pixels.

The inequalities of Expressions (5) and (6) are satisfied because imaging optical systems having different focal lengths in the present embodiment have the same number of identical focal points.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal point compound eye image pickup apparatus capable of outputting an image having a high image quality and a high resolution. In other words, the present invention can optimize the sizes, the total number, and the ratio of the number of different focal points and the number of identical focal points of the facets in accordance with the size of the image pickup element, thereby providing a different focal point compound eye image pickup apparatus that is small and capable of outputting an image having a high image quality and a high resolution.

The configuration of the present invention allows an image pickup apparatus such as a video camera and a digital camera to be developed into a thin image pickup apparatus that has a high magnification ratio and is capable of easily acquiring space information of an object space whose image is to be captured.

Embodiment 5

Figure 14:
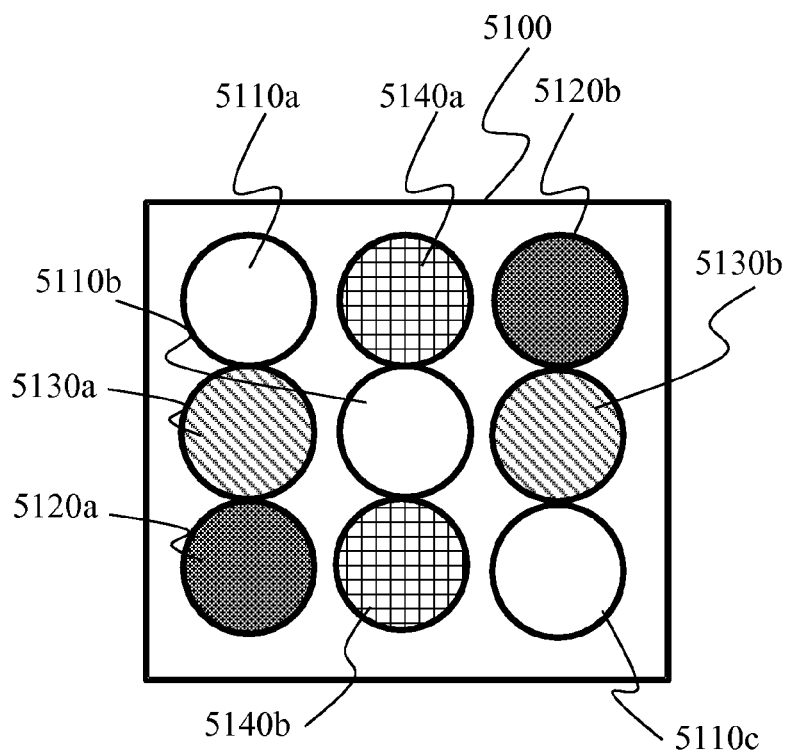
FIG. 14 is a front view of an image pickup unit according to Embodiment 5 of the present invention.

A compound eye image pickup apparatus in the present embodiment has the same configuration as that of Embodiment 1 except for configurations of imaging optical systems and an image pickup element 5200 of an image pickup unit 5100, and thus description will be made of the imaging optical systems and the image pickup element 5200. FIG. 14 is a front view of the image pickup unit 5100.

The compound eye image pickup apparatus includes nine imaging optical systems (image pickup optical systems) 5110a, 5110b, and 5110c; 5120a and 5120b; 5130a and 5130b; and 5140a and 5140b that each forms an optical image of an object, and the image pickup element 5200.

Each imaging optical system includes other members such as an aperture stop (not illustrated). The imaging optical system includes a plurality of lenses.

The image pickup element 5200 includes the nine partitioned facet image pickup regions 5210a, 5210b, and 5210c; 5220a and 5220b; 5230a and 5230b; and 5240a and 5240b.

The facet image pickup regions 5210a, 5210b, and 5210c respectively correspond to imaging optical systems 5110a, 5110b, and 5110c, and the facet image pickup regions 5220a and 5220b respectively correspond to imaging optical systems 5120a and 5120b. The facet image pickup regions 5230a and 5230b respectively correspond to imaging optical systems 5130a and 5130b, and the facet image pickup regions 5240a and 5240b respectively correspond to imaging optical systems 5140a and 5140b.

Similarly to Embodiment 1, optical axes of the nine imaging optical systems (image pickup optical systems) 5110a, 5110b, and 5110c; 5120a and 5120b; 5130a and 5130b; and 5140a and 5140b are arranged substantially parallel to one another. The imaging optical systems labeled with an identical reference number (a, b, and c, or, a and b) have an identical focal length, and the imaging optical systems (5110, 5120, 5130, and 5140) labeled with different reference numbers have focal lengths different from one another. In the present embodiment, four sets of imaging optical systems having different focal lengths are provided. The imaging optical systems 5110a, 5110b, and 5110c (wide facets) are a set of wide-angle imaging optical systems having a shortest focal length among the nine imaging optical systems. The imaging optical systems 5120a and 5120b (wide-middle facets) have focal lengths longer than those of the imaging optical systems 5110a and 5110b. The imaging optical systems 5130a and 5130b (tele-middle facets) have focal lengths longer than those of the imaging optical systems 5120a and 5120b. The imaging optical systems 5140a and 5140b (tele facets) have focal lengths longer than those of those of the imaging optical systems 5130a and 5130b, and are a set of telephoto imaging optical systems having a longest focal length among the nine imaging optical systems.

Next, referring to FIG. 15, a detailed configuration of the image pickup unit 5100 in the present embodiment will be described.

Figure 15:
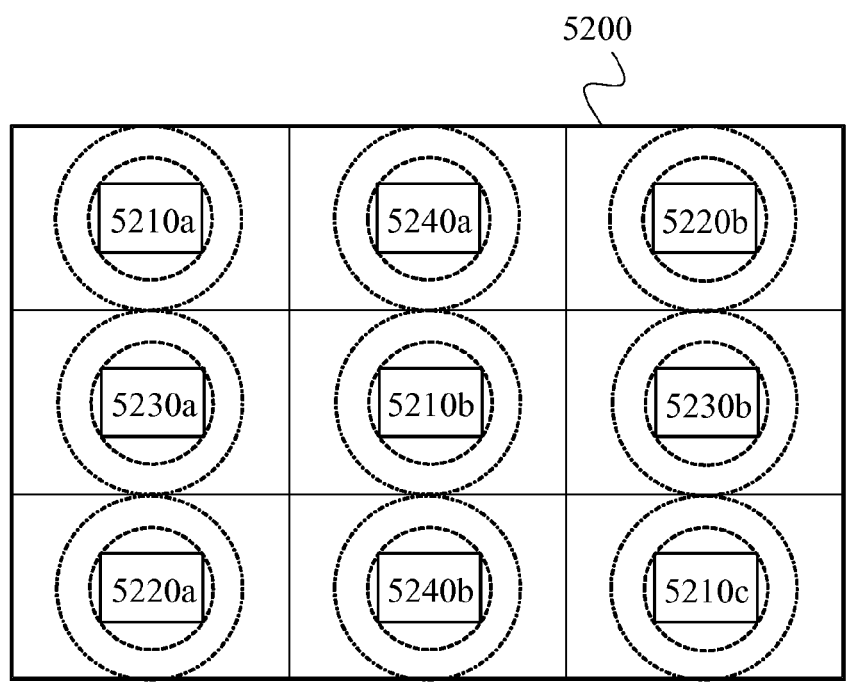
FIG. 15 is a relational diagram of imaging optical systems and image pickup regions according to Embodiment 5 of the present invention.

FIG. 15 is a schematic diagram of the image pickup element 5200 in the image pickup unit. A solid outer rectangle represents the image pickup element, which has a long side of 36 mm, a short side of 24 mm, and a pixel pitch of 1.2 µm. In FIG. 15, a dotted circle represents an image circle of an imaging optical system, a dashed circle represents an outer circumference of the imaging optical system, and a solid inscribed rectangle of the image circle represents the facet image pickup region. When the image circles are larger than the outer circumferences of the imaging optical systems, the imaging optical systems can be arranged such that the image circles are in touch with each other. When the outer circumferences of the imaging optical systems are larger than the image circles, the imaging optical systems need to be arranged to avoid any interference among them. The circles representing the outer circumferences of the imaging optical systems in the present embodiment are in touch with each other, and the diameters of the circles representing the outer circumferences are 1.5 times larger than the diameters of the image circles approximately. Specifically, the diameter of each imaging optical system is 8 mm, and the diameter of each image circle is 5.33 mm. In other words, the optical systems are arranged such that, when the image circles of the optical systems are larger than the circles representing the outer circumferences of the optical systems, the circles are arranged in touch with each other along at least one of sides of the image pickup element 5200 that are orthogonal to each other.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The long sides of the facet image pickup region are each 4.43 mm approximately, and the short sides thereof are each 2.96 mm approximately, and thus the ratio of the short and long sides is 2:3 as with the image pickup element. Setting the facet image pickup region in this manner allows its approximate number of pixels to be estimated, based on its area ratio relative to the image pickup element, to be 9.11 million pixels approximately in the present embodiment.

The group Grw of imaging optical systems having a shortest focal length in the present embodiment includes the imaging optical systems 5110a, 5110b, and 5110c illustrated in FIG. 14, and the number $N_w$ of the imaging optical systems is three. The group Grt of the imaging optical systems having a longest focal length in the present embodiment includes the imaging optical systems 5140a and 5140b illustrated in FIG. 14, and the number $N_t$ of the imaging optical systems is two.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of the imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limit of Expression (1), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limits of Expressions (1) and (4), which indicates that the compound eye image pickup apparatus is capable of outputting an image having a sufficient number of pixels.

The inequalities of Expressions (5) and (6) are satisfied because imaging optical systems having different focal lengths in the present embodiment have a larger number of identical focal points for wide facets than those for tele facets.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal point compound eye image pickup apparatus capable of outputting an image having a high image quality and a high resolution. In other words, the present invention can optimize the sizes, the total number, and the ratio of the number of different focal points and the number of identical focal points of the facets in accordance with the size of the image pickup element, thereby providing a different focal point compound eye image pickup apparatus that is small and capable of outputting an image having a high image quality and a high resolution.

The configuration of the present invention allows an image pickup apparatus such as a video camera and a digital camera to be developed into a thin image pickup apparatus that has a high magnification ratio and is capable of easily acquiring space information of an object space whose image is to be captured.

Embodiment 6

Figure 16:
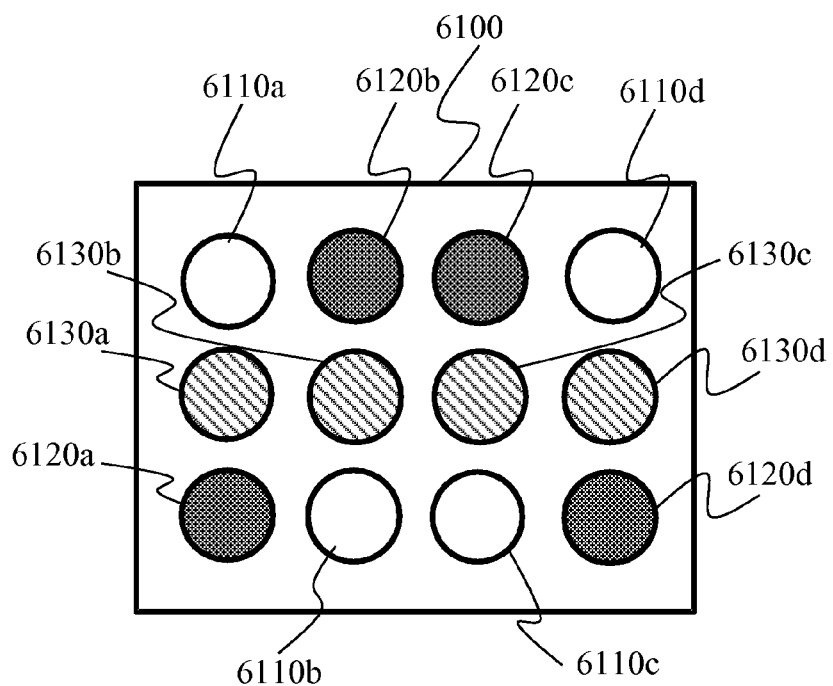
FIG. 16 is a front view of an image pickup unit according to Embodiment 6 of the present invention.

A compound eye image pickup apparatus in the present embodiment has the same configuration as that of Embodiment 1 except for configurations of imaging optical systems and an image pickup element 6200 of an image pickup unit 6100, and thus description will be made of the imaging optical systems and the image pickup element 6200. FIG. 16 is a front view of the image pickup unit 6100.

The compound eye image pickup apparatus includes 12 imaging optical systems (image pickup optical systems) 6110a, 6110b, 6110c, and 6110d; 6120a, 6120b, and 6120c; and 6120d, 6130a, 6130b, 6130c, and 6130d that each forms an optical image of an object, and the image pickup element 6200.

Each imaging optical system includes other members such as an aperture stop (not illustrated). The imaging optical system includes a plurality of lenses.

The image pickup element 6200 includes 12 partitioned facet image pickup regions 6210a, 6210b, 6210c, and 6210d; 6220a, 6220b, 6220c, and 6220d; and 6230a, 6230b, 6230c, and 6230d.

The facet image pickup regions 6210a, 6210b, 6210c, and 6210d respectively correspond to the imaging optical systems 6110a, 6110b, 6110c, and 6110d, and the facet image pickup regions 6220a, 6220b, 6220c, and 6220d respectively correspond to the imaging optical systems 6120a, 6120b, 6120c, and 6120d. The facet image pickup regions 6230a, 6230b, 6230c, and 6230d respectively correspond to the imaging optical systems 6130a, 6130b, 6130c, and 6130d.

Similarly to Embodiment 1, optical axes of the 12 imaging optical systems (image pickup optical systems) 6110a, 6110b, 6110c, and 6110d; 6120a, 6120b, and 6120c; and 6120d, 6130a, 6130b, 6130c, and 6130d are arranged substantially parallel to one another. The four imaging optical systems a, b, c, and d labeled with an identical reference number have an identical focal length, the imaging optical systems labeled with different reference numbers (6110, 6120, and 6130) have focal lengths different from one another. In the present embodiment, three sets of imaging optical systems having different focal lengths are provided. The imaging optical systems 6110a, 6110b, 6110c, and 6110d (wide facets) are a set of wide-angle imaging optical systems having a shortest focal length among the 12 imaging optical systems. The imaging optical systems 6120a, 6120b, 6120c, and 6120d (middle facets) have focal lengths longer than those of the imaging optical systems 6110a, 6110b, 6110c, and 6110d. The imaging optical systems 6130a, 6130b, 6130c, and 6130d (tele facets) have focal lengths longer than those of the imaging optical systems 6120a, 6120b, 6120c, and 6120d, and are a set of telephoto imaging optical systems having a longest focal length among the 12 imaging optical systems.

Next, referring to FIG. 17, a detailed configuration of the image pickup unit 6100 in the present embodiment will be described.

Figure 17:
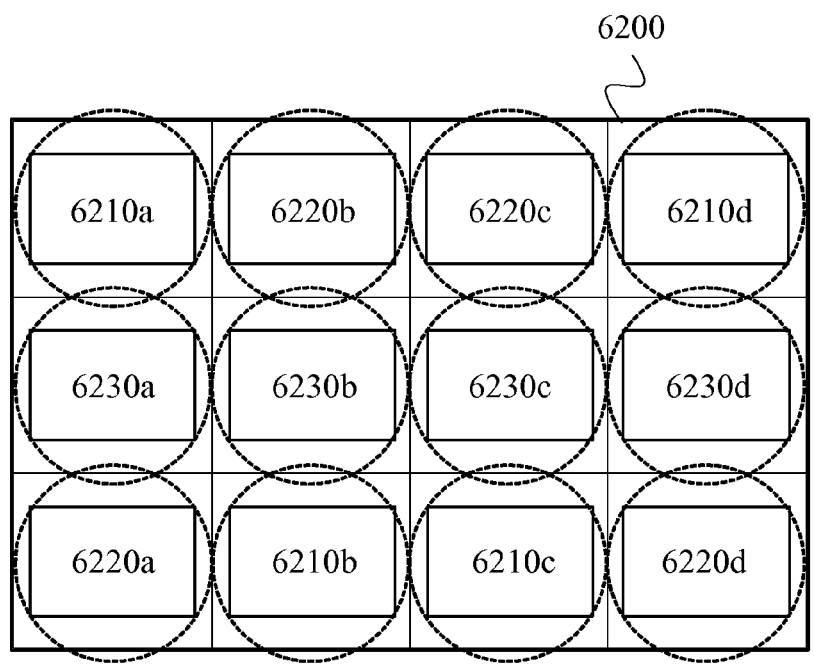
FIG. 17 is a relational diagram of imaging optical systems and image pickup regions according to Embodiment 6 of the present invention.

FIG. 17 is a schematic diagram of the image pickup element 6200 in the image pickup unit. A solid outer rectangle represents the image pickup element, which has a long side of 22.3 mm, a short side of 14.9 mm, and a pixel pitch of 1.4 μm. In FIG. 17, a dotted circle represents an image circle of an imaging optical system, and a solid inscribed rectangle of the image circle represents the facet image pickup region. In the present embodiment, the imaging optical systems have their image circles arranged in touch with each other in the long-side direction, and each have a diameter of 5.57 mm approximately because the long sides of the image pickup element each have a length of 22.3 mm. In the configuration as illustrated in FIG. 17, an interval between adjacent facet image pickup regions is larger in long-side direction than in the short-side direction. The present embodiment has a configuration in which the diameters of the outer circumferences of the imaging optical systems are smaller than intervals between centers of image circles adjacent in the short-side direction, and the image circles partially overlap each other, so as to achieve larger areas of the facet image pickup regions. In other words, the optical systems are arranged such that the image circles thereof partially overlap each other along at least one of sides of the image pickup element 6200 that are orthogonal to each other when the image circle of each optical system is larger than the outer circumference of the optical system.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The long sides of the facet image pickup region are each 4.63 mm approximately, and the short sides thereof are each 3.09 mm approximately, and thus the ratio of the short and long sides is 2:3 as with the image pickup element. Setting the facet image pickup region in this manner allows its approximate number of pixels to be estimated, based on its area ratio relative to the image pickup element, to be 7.31 million pixels approximately in the present embodiment.

The group Grw of imaging optical systems having a shortest focal length in the present embodiment includes the imaging optical systems 6110a, 6110b, 6110c, and 6110d illustrated in FIG. 16, and the number $N_w$ of the imaging optical systems is four. The group Grt of imaging optical systems having a longest focal length in the present embodiment includes the imaging optical systems 6130a, 6130b, 6130c, and 6130d illustrated in FIG. 16, and the number $N_t$ of the imaging optical systems is four.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of the imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limits of Expressions (1) and (4), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limits of Expressions (1) and (4), which indicates that the compound eye image pickup apparatus is capable of outputting an image having a sufficient number of pixels.

The inequalities of Expressions (5) and (6) are satisfied because imaging optical systems having different focal lengths in the present embodiment have the same number of identical focal points.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal point compound eye image pickup apparatus capable of outputting an image having a high image quality and a high resolution. In other words, the present invention can optimize the sizes, the total number, and the ratio of the number of different focal points and the number of identical focal points of the facets in accordance with the size of the image pickup element, thereby providing a different focal point compound eye image pickup apparatus that is small and capable of outputting an image having a high image quality and a high resolution.

The configuration of the present invention allows an image pickup apparatus such as a video camera and a digital camera to be developed into a thin image pickup apparatus that has a high magnification ratio and is capable of easily acquiring space information of an object space whose image is to be captured.

Embodiment 7

Figure 18:
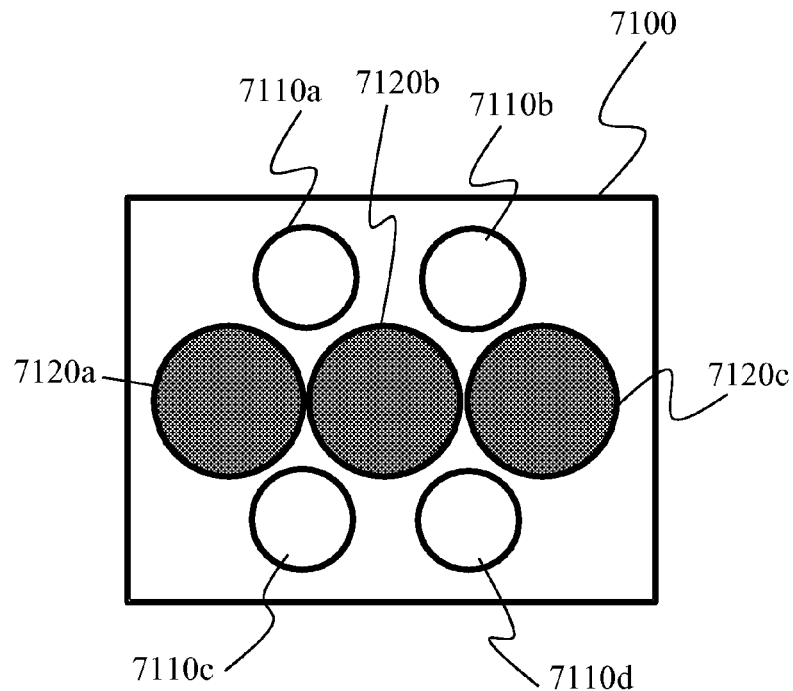
FIG. 18 is a front view of an image pickup unit according to Embodiment 7 of the present invention.

A compound eye image pickup apparatus in the present embodiment has the same configuration as that of Embodiment 1 except for configurations of imaging optical systems and an image pickup element 7200 of an image pickup unit 7100, and thus description will be made of the imaging optical systems and the image pickup element 7200. FIG. 18 is a front view of the image pickup unit 7100.

The compound eye image pickup apparatus includes seven imaging optical systems (image pickup optical systems) 7110a, 7110b, 7110c, and 7110d; and 7120a, 7120b, and 7120c that each forms an optical image of an object, and the image pickup element 7200.

Each imaging optical system includes other members such as an aperture stop (not illustrated). The imaging optical system includes a plurality of lenses.

The image pickup element 7200 includes the seven partitioned facet image pickup regions 7210a, 7210b, 7210c, and 7210d; and 7220a, 7220b, and 7220c.

The facet image pickup regions 7210a, 7210b, 7210c, and 7210d respectively correspond to the imaging optical systems 7110a, 7110b, 7110c, and 7110d, and the facet image pickup regions 7220a, 7220b, and 7220c respectively correspond to the imaging optical systems 7120a, 7120b, and 7120c.

Similarly to Embodiment 1, optical axes of the seven imaging optical systems (image pickup optical systems) 7110a, 7110b, 7110c, and 7110d; and 7120a, 7120b, and 7120c are arranged substantially parallel to one another. The imaging optical systems labeled with an identical reference number (a, b, c, and d, or a, b, and c) have an identical focal length, and the imaging optical systems labeled with different reference numbers (7110 and 7120) have focal lengths different from one another. In the present embodiment, two sets of imaging optical systems having different focal lengths are provided. The imaging optical systems 7110a, 7110b, 7110c, and 7110d (wide facets) are a set of wide-angle imaging optical systems having focal lengths shorter than those of the imaging optical systems 7120a, 7120b, and 7120c. In contrast, the imaging optical systems 7120a, 7120b, and 7120c (tele facets) are a set of telephoto imaging optical systems having focal lengths longer than those of the imaging optical systems 7110a, 7110b, 7110c, and 7110d.

Next, referring to FIG. 19, a detailed configuration of the image pickup unit 7100 in the present embodiment will be described.

Figure 19:
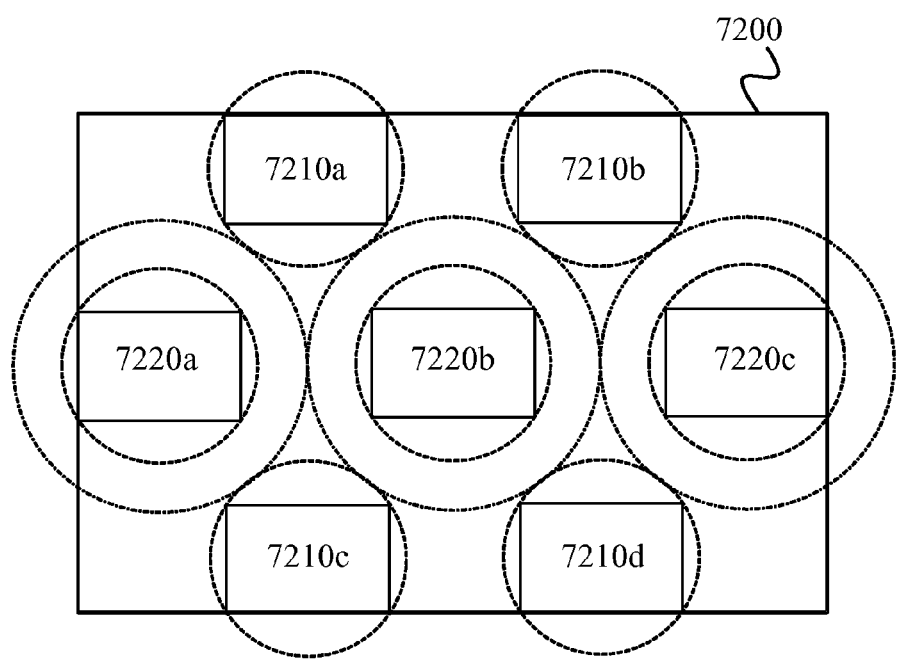
FIG. 19 is a relational diagram of imaging optical systems and image pickup regions according to Embodiment 7 of the present invention.

FIG. 19 is a schematic diagram of the image pickup element 7200 in the image pickup unit. A solid outer rectangle represents the image pickup element, which has a long side of 36 mm, a short side of 24 mm, and a pixel pitch of 2.0 μm. In FIG. 19, a dotted circle represents an image circle of an imaging optical system, a dashed circle represents an outer circumference of the imaging optical system, and a solid inscribed rectangle of the image circle represents the facet image pickup region. When the image circles are larger than the outer circumferences of the imaging optical systems, the imaging optical systems can be arranged such that the image circles are in touch with each other. When the outer circumferences of the imaging optical systems are larger than the image circles, the imaging optical systems need to be arranged to avoid any interference among them. In the imaging optical systems 7110a, 7110b, 7110c, and 7110d, the outer circumferences of the imaging optical systems are equal to or smaller than the image circles. In the imaging optical systems 7120a, 7120b, and 7120c, the diameters of the circles representing the outer circumferences are 1.5 times larger than the diameters of the image circles, the image circles of the imaging optical systems 7110a, 7110b, 7110c, and 7110d are in touch with the outer circumferences of the imaging optical systems 7120a, 7120b, and 7120c. In other words, the optical systems are arranged such that, when the circle representing the outer circumference of any optical system is larger than the image circle thereof, the circle representing the outer circumference of the optical system is in touch with the image circle of another optical system. The image circles of the imaging optical systems 7110a, 7110b, 7110c, and 7110d and the imaging optical systems 7120a, 7120b, and 7120c each have a diameter of 4.70 mm approximately, and the outer circumferences of the imaging optical systems 7120a, 7120b, and 7120c each have a diameter of 7.05 mm approximately.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The facet image pickup region has a long side of 7.81 mm approximately and a short side of 5.21 mm approximately, and thus the ratio of the short and long sides is 2:3. Setting the facet image pickup region in this manner allows its approximate number of pixels to be estimated, based on its area ratio relative to the image pickup element, to be 10.18 million pixels approximately in the present embodiment.

The group Grw of imaging optical systems having a shortest focal length in the present embodiment includes the imaging optical systems 7110a, 7110b, 7110c, and 7110d illustrated in FIG. 18, and the number $N_w$ of the imaging optical systems is four. The group Grt of imaging optical systems having a longest focal length in the present embodiment includes the imaging optical systems 7120a, 7120b, and 7120c illustrated in FIG. 18, and the number $N_t$ of the imaging optical systems is three.

Tables 1 and 2 list the area S of the image pickup region of the image pickup element, the pixel pitch p, the average number $P_{AVE}$ of pixels of the facet image pickup region, the sum $P_{SUM}$ of the numbers of pixels, the number $N_t$ of the imaging optical systems having the longest focal length, and the number var of different focal points for Expressions (1) and (4) in the present embodiment.

Similarly, Table 3 lists the average number $P_{AVE}$ of pixels of the facet image pickup region, the sum $P_{SUM}$ of the numbers of pixels, the number $N_w$ of the imaging optical systems on the most wide-angle side, and the number var of different focal points for Expression (5) in the present embodiment.

Tables 1 and 2 show that the number $N_t$ of the imaging optical systems having the longest focal length in the present embodiment is greater than the lower limits of Expressions (1) and (4), which indicates that the compound eye image pickup apparatus is capable of outputting an image having a sufficiently high S/N ratio. Tables 1 and 2 also show that the number $N_t$ of the imaging optical systems having the longest focal length in the present embodiment is less than the upper limits of Expressions (1) and (4), which indicates that the compound eye image pickup apparatus is capable of outputting an image having a sufficient number of pixels.

The inequalities of Expressions (5) and (6) are satisfied because imaging optical systems having different focal lengths in the present embodiment have a larger number of identical focal points for wide facets than those for tele facets.

Thus, the compound eye image pickup apparatus in the present embodiment has a configuration in which the sizes, the total number, the number of different focal points, and the number of identical focal points of the facets are appropriate for the size of the image pickup element, and this configuration achieves a different focal point compound eye image pickup apparatus capable of outputting an image having a high image quality and a high resolution. In other words, the present invention can optimize the sizes, the total number, and the ratio of the number of different focal points and the number of identical focal points of the facets in accordance with the size of the image pickup element, thereby providing a different focal point compound eye image pickup apparatus that is small and capable of outputting an image having a high image quality and a high resolution.

Embodiment 8

Figure 21:
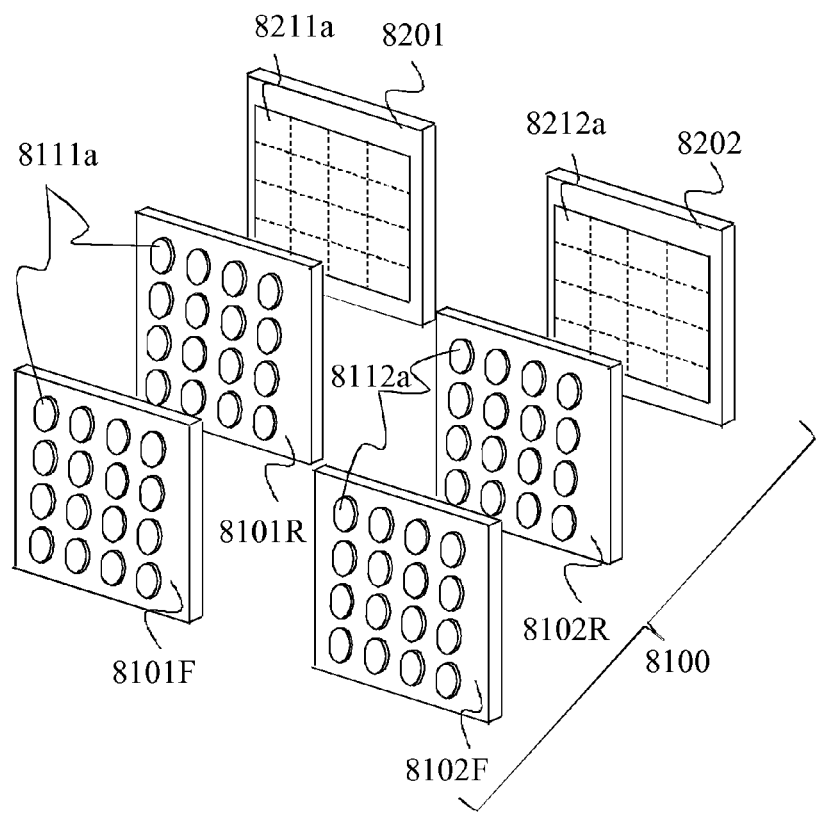
FIG. 21 is a perspective diagram of an image pickup unit of a compound eye image pickup apparatus according to Embodiment 8 of the present invention.
Figure 22:
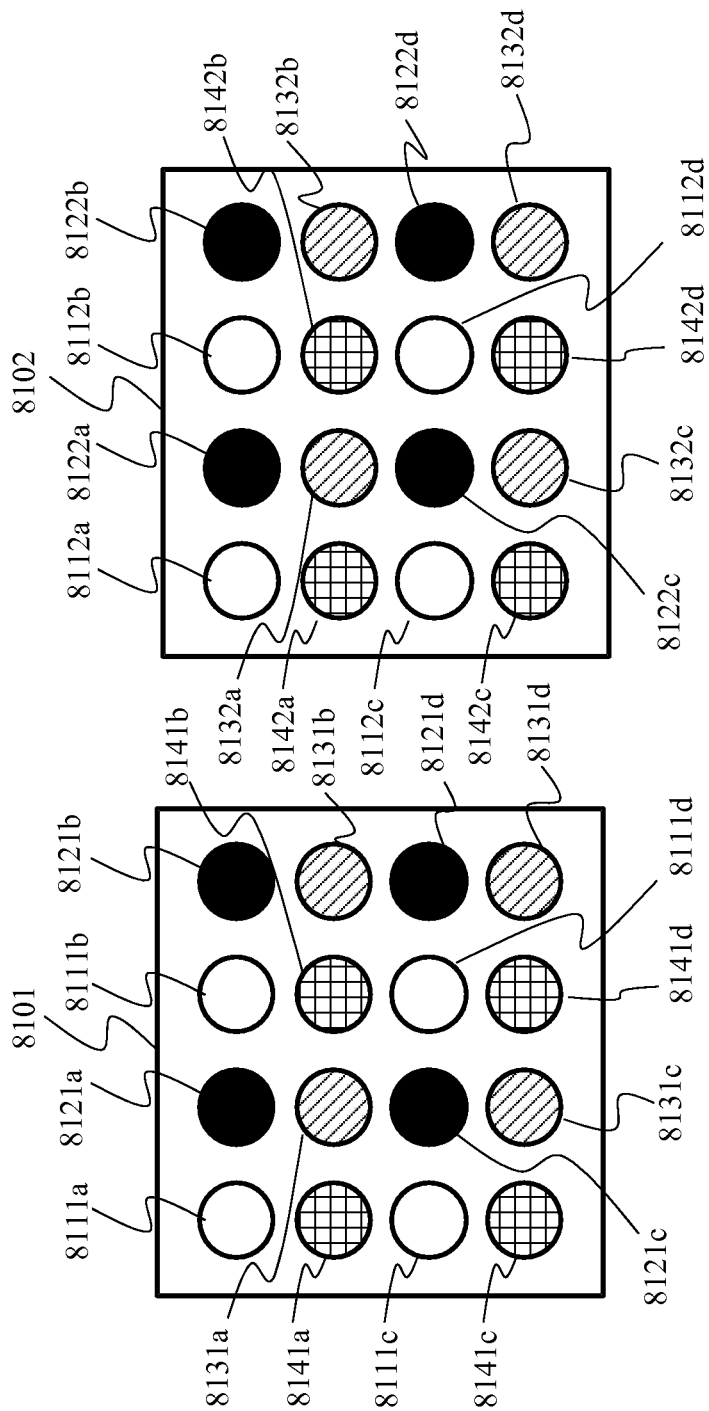
FIG. 22 is a front view of an image pickup unit according to Embodiment 8 of the present invention.

The compound eye image pickup apparatus in the present embodiment includes two image pickup units 8101 and 8102 and two image pickup elements 8201 and 8202, which are arranged side by side as two sets of the image pickup unit and the image pickup element in Embodiment 1 within one compound eye image pickup apparatus. FIG. 21 is a perspective diagram of the image pickup units 8101 and 8102, and FIG. 22 is a front view of the image pickup units 8101 and 8102. As illustrated in FIG. 22, the image pickup unit 8101 includes the 16 imaging optical systems (image pickup optical systems) 8111a, 8111b, 8111c, and 8111d; 8121a, 8121b, 8121c, and 8121d; 8131a, 8131b, 8131c, and 8131d; and 8141a, 8141b, 8141c, and 8141d that each forms an optical image of an object, and the image pickup element 8201. Similarly, the image pickup unit 8102 includes the 16 imaging optical systems (image pickup optical systems) 8112a, 8112b, 8112c, and 8112d; 8122a, 8122b, 8122c, and 8122d; 8132a, 8132b, 8132c, and 8132d; and 8142a, 8142b, 8142c, and 8142d that each forms an optical image of an object, and the image pickup element 8202.

Each imaging optical system of the image pickup unit 8101 includes a front unit 8101F, a rear unit 8101R, and other members such as an aperture stop (not illustrated). This imaging optical system includes a plurality of lenses. Each imaging optical system of the image pickup unit 8102 includes a front unit 8102F, a rear unit 8102R, and other members such as an aperture stop (not illustrated). This imaging optical system includes a plurality of lenses.

The image pickup element 8201 includes 16 partitioned facet image pickup regions 8211a, 8211b, 8211c, and 8211d; 8221a, 8221b, 8221c, and 8221d; 8231a, 8231b, 8231c, and 8231d; and 8241a, 8241b, 8241c, and 8241d. Similarly, the image pickup element 8202 includes 16 partitioned facet image pickup regions 8212a, 8212b, 8212c, and 8212d; 8222a, 8222b, 8222c, and 8222d; 8232a, 8232b, 8232c, and 8232d; and 8242a, 8242b, 8242c, and 8242d.

The facet image pickup regions 8211a, 8211b, 8211c, and 8211d respectively correspond to the imaging optical systems

8111*a*, 8111*b*, 8111*c*, and 8111*d*, and the facet image pickup regions 8212*a*, 8212*b*, 8212*c*, and 8212*d* respectively correspond to the imaging optical systems 8112*a*, 8112*b*, 8112*c*, and 8112*d*. The facet image pickup regions 8221*a*, 8221*b*, 8221*c*, and 8221*d* respectively correspond to the imaging optical systems 8121*a*, 8121*b*, 8121*c*, and 8121*d*, and the facet image pickup regions 8222*a*, 8222*b*, 8222*c*, and 8222*d* respectively correspond to the imaging optical systems 8122*a*, 8122*b*, 8122*c*, and 8122*d*. The facet image pickup regions 8231*a*, 8231*b*, 8231*c*, and 8231*d* respectively correspond to the imaging optical systems 8131*a*, 8131*b*, 8131*c*, and 8131*d*, and the facet image pickup regions 8232*a*, 8232*b*, 8232*c*, and 8232*d* respectively correspond to the imaging optical systems 8132*a*, 8132*b*, 8132*c*, and 8132*d*. The facet image pickup regions 8241*a*, 8241*b*, 8241*c*, and 8241*d* respectively correspond to the imaging optical systems 8141*a*, 8141*b*, 8141*c*, and 8141*d*, and the facet image pickup regions 8242*a*, 8242*b*, 8242*c*, and 8242*d* respectively correspond to the imaging optical systems 8142*a*, 8142*b*, 8142*c*, and 8142*d*.

As illustrated in FIG. 22, optical axes of the 32 imaging optical systems (facets) 8111*a* to 8111*d*, 8121*a* to 8121*d*, 8131*a* to 8131*d*, 8141*a* to 8141*d*, 8112*a* to 8112*d*, 8122*a* to 8122*d*, 8132*a* to 8132*d*, and 8142*a* to 8142*d* are arranged substantially parallel to one another.

In the present embodiment, the image pickup units 8101 and 8102 have the same configuration and the image pickup elements 8201 and 8202 have the same configuration, and thus hereinafter only the image pickup unit 8101 and the image pickup element 8201 will be described in detail.

The four imaging optical systems a, b, c, and d labeled with an identical reference number have an identical focal length, and the imaging optical systems (8111, 8121, 8131, and 8141) labeled with different reference numbers have focal lengths different from one another. In the present embodiment, four sets of imaging optical systems having different focal lengths are provided to each image pickup unit. The imaging optical systems (second optical systems) 8111*a*, 8111*b*, 8111*c*, and 8111*d* (wide facets) are a set of wide-angle imaging optical systems having a shortest focal length among the 16 imaging optical systems. The imaging optical systems 8121*a*, 8121*b*, 8121*c*, and 8121*d* (wide-middle facets) have focal lengths longer than those of the imaging optical systems 8111*a*, 8111*b*, 8111*c*, and 8111*d*. The imaging optical systems 8131*a*, 8131*b*, 8131*c*, and 8131*d* (tele-middle facets) have focal lengths longer than those of the imaging optical systems 8121*a*, 8121*b*, 8121*c*, and 8121*d*. The imaging optical systems (first optical systems) 8141*a*, 8141*b*, 8141*c*, and 8141*d* (tele facets) have focal lengths longer than those of those of the imaging optical systems 8131*a*, 8131*b*, 8131*c*, and 8131*d*, and are a set of telephoto imaging optical systems having a longest focal length among the 16 imaging optical systems. The image pickup unit 8102 has the same configuration, and thus description thereof will be omitted.

Next, referring to FIGS. 21 and 23, a detailed configuration of an image pickup unit 8100 in the present embodiment will be described. As illustrated in FIG. 21, the image pickup unit 8100 in the present embodiment includes the two image pickup units 8101 and 8102.

Figure 23:
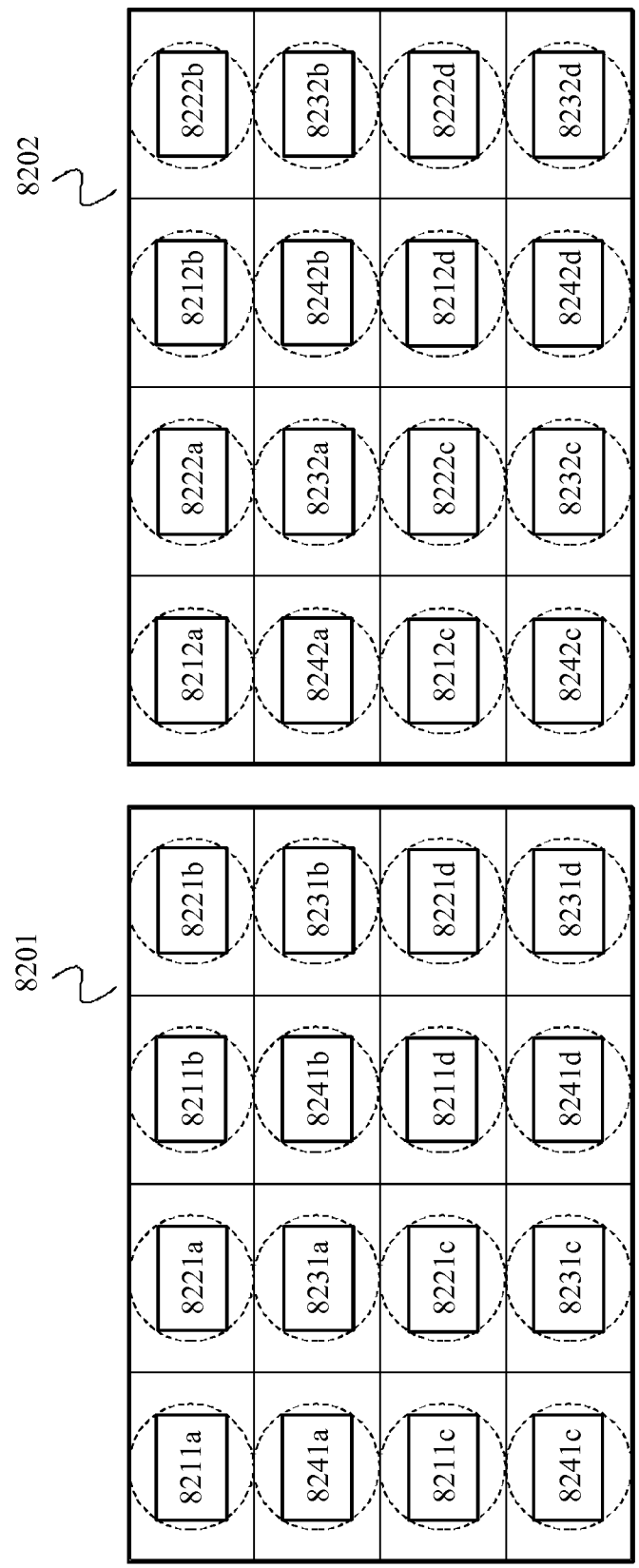
FIG. 23 is a relational diagram of imaging optical systems and image pickup regions according to Embodiment 8 of the present invention.

FIG. 23 is a schematic diagram of the image pickup elements 8201 and 8202 in the image pickup unit. A solid outer rectangle represents the image pickup element, which has a long side of 36 mm, a short side of 24 mm, and a pixel pitch of 1.2 μm. In FIG. 23, a dotted circle represents an image circle of an imaging optical system, and a solid inscribed rectangle of the image circle represents the facet image pickup region. In the present embodiment, the image circles of the imaging optical systems are arranged in touch with each other in the short-side direction, and each have a diameter of 6.00 mm approximately because the short side of the image pickup element has a length of 24 mm. In other words, the optical systems are arranged such that the image circles thereof are in touch with each other along at least one of sides of the image pickup elements 8201 and 8202 that are orthogonal to each other.

Next, the inscribed facet image pickup region of the image circle of each imaging optical system will be described. The facet image pickup region can be set anywhere in the image circle as described above and can have an individual size, but is set as a rectangle of an identical size in the present embodiment. The rectangle is arranged such that the short sides of the facet image pickup region are parallel to the short sides of the image pickup element, and similarly, the long sides of the facet image pickup region are parallel to the long sides of the image pickup element. The facet image pickup region has a long side of 4.99 mm approximately and a short side of 3.33 mm approximately, and thus the ratio of the short and long sides is 2:3. Setting the facet image pickup region in this manner allows its approximate number of pixels to be estimated, based on its area ratio relative to the image pickup element, to be 11.54 million pixels approximately in the present embodiment.

The group Grw of imaging optical systems having a shortest focal length in the image pickup unit 8101 in the present embodiment includes the imaging optical systems 8111*a*, 8111*b*, 8111*c*, and 8111*d* illustrated in FIG. 22, and the number $N_w$ of the imaging optical systems is four. The group Grt of imaging optical systems having a longest focal length in the present embodiment includes the imaging optical systems 8141*a*, 8141*b*, 8141*c*, and 8141*d* illustrated in FIG. 22, and the number $N_t$ of the imaging optical systems is four. The image pickup unit 8102 has the same configuration as that of the image pickup unit 8101, and thus $N_w=4$ and $N_t=4$.

As described above, the image pickup unit 8100 in the present embodiment includes the two image pickup units 8101 and 8102, and the image pickup units 8101 and 8102 each have the same configuration as that of the image pickup unit 1100 in Embodiment 1. Thus, Expressions (1) to (6) in the present embodiment are the same as those in Embodiment 1, and thus a detailed description thereof will be omitted. The present embodiment describes the compound eye image pickup apparatus including the two image pickup units 8101 and 8102, but the present invention is not limited thereto, and the compound eye image pickup apparatus may include, for example, three or more (that is, a plurality of) image pickup units. The image pickup units included in the compound eye image pickup apparatus are not limited to the image pickup unit 1100 in Embodiment 1, but may be any image pickup unit in the other embodiments described above, or may be a combination of the image pickup units in Embodiments 1 to 7. In other words, the compound eye image pickup apparatus in the present invention may include a plurality of image pickup units in Embodiments 1 to 7.

The configuration of the present invention allows an image pickup apparatus such as a video camera and a digital camera to be developed into a thin image pickup apparatus that has a high magnification ratio and is capable of easily acquiring space information of an object space whose image is to be captured.

Each of the embodiments can provide an output image having a high image quality and a high resolution by optimizing the sizes, the total number, and the ratio of the number of different focal points and the number of identical focal points of the facets in accordance with the size of the image pickup element.

TABLE 1

| Embodi-ment | S | p | $P_{AVE}$ | $P_{SUM}$ | var | Expression (1) Lower limit | $N_t$ | Expression (1) Upper limit |
|---|---|---|---|---|---|---|---|---|
| 1 | 864.0 | 1.2 | 11.54 | 184.62 | 4 | 1.17 | 4 | 23.08 |
| 2 | 332.3 | 1.2 | 7.89 | 70.97 | 4 | 0.66 | 2 | 8.87 |
| 3 | 864.0 | 1.2 | 8.41 | 302.69 | 4 | 1.61 | 9 | 37.84 |
| 4 | 28.5 | 1.0 | 2.44 | 9.77 | 2 | 0.26 | 2 | 2.44 |
| 5 | 864.0 | 1.2 | 9.11 | 81.99 | 4 | 1.48 | 2 | 10.25 |
| 6 | 332.3 | 1.4 | 7.31 | 87.67 | 3 | 0.52 | 4 | 14.61 |
| 7 | 864.0 | 2.0 | 10.18 | 71.28 | 2 | 0.48 | 3 | 17.82 |

TABLE 2

| Embodi-ment | S | p | $P_{AVE}$ | $P_{SUM}$ | var | Expression (4) Lower limit | $N_t$ | Expression (4) Upper limit |
|---|---|---|---|---|---|---|---|---|
| 1 | 864.0 | 1.2 | 11.54 | 184.62 | 4 | 2.08 | 4 | 6.89 |
| 2 | 332.3 | 1.2 | 7.89 | 70.97 | 4 | 1.17 | 2 | 2.65 |
| 3 | 864.0 | 1.2 | 8.41 | 302.69 | 4 | 2.85 | 9 | 11.29 |
| 4 | 28.5 | 1.0 | 2.44 | 9.77 | 2 | 0.47 | 2 | 0.73 |
| 5 | 864.0 | 1.2 | 9.11 | 81.99 | 4 | 2.63 | 2 | 3.06 |
| 6 | 332.3 | 1.4 | 7.31 | 87.67 | 3 | 0.93 | 4 | 4.36 |
| 7 | 864.0 | 2.0 | 10.18 | 71.28 | 2 | 0.85 | 3 | 5.32 |

TABLE 3

| Embodi-ment | $P_{AVE}$ | $P_{SUM}$ | var | Expression (5) Lower limit | $N_w$ |
|---|---|---|---|---|---|
| 1 | 11.54 | 184.62 | 4 | 4 | 4 |
| 2 | 7.89 | 70.97 | 4 | 2 | 3 |
| 3 | 8.41 | 302.69 | 4 | 9 | 9 |
| 4 | 2.44 | 9.77 | 2 | 2 | 2 |
| 5 | 9.11 | 81.99 | 4 | 2 | 3 |
| 6 | 7.31 | 87.67 | 3 | 4 | 4 |
| 7 | 10.18 | 71.28 | 2 | 3 | 4 |

TABLE 4

| Embodi-ment | $P_{AVE}$ | $P_{SUM}$ | var | Expression (6) Lower limit | $N_w$ | Expression (6) Upper limit |
|---|---|---|---|---|---|---|
| 1 | 11.54 | 184.62 | 4 | 4 | 4 | 5 |
| 2 | 7.89 | 70.97 | 4 | 2 | 3 | 3 |
| 3 | 8.41 | 302.69 | 4 | 9 | 9 | 10 |
| 4 | 2.44 | 9.77 | 2 | 2 | 2 | 3 |
| 5 | 9.11 | 81.99 | 4 | 2 | 3 | 3 |
| 6 | 7.31 | 87.72 | 3 | 4 | 4 | 5 |
| 7 | 10.18 | 71.28 | 2 | 3 | 4 | 4 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-045416, filed on Mar. 7, 2014, and No. 2014-193605, filed on Sep. 24, 2014, which are hereby incorporated by reference wherein in their entireties.

What is claimed is:

1. A compound eye image pickup apparatus comprising:
a plurality of optical systems including a first optical system having a longest focal length and an optical system group of a plurality of second optical systems having focal lengths different from the longest focal length; and
an image pickup element including a plurality of image pickup regions corresponding to the plurality of optical systems,
wherein a condition expression below is satisfied, $$\frac{0.15^2 \times S}{p^2 \times P_{AVE}} \le N_t \le \frac{P_{SUM}}{\text{var} \times 2.0 \times 10^6}$$

where p (mm) represents a pixel pitch of the image pickup element, S (mm$^2$) represents an area of the image pickup element, $P_{AVE}$ represents an average value of the number of pixels of each image pickup region, $P_{SUM}$ represents a sum of the number of pixels of each image pickup region, $N_t$ represents the number of the first optical systems among the plurality of optical systems, and var represents the number of the different focal lengths.

2. The compound eye image pickup apparatus according to claim 1,
wherein a condition expression below is satisfied, $$\text{floor}\left(\frac{P_{SUM}}{P_{AVE}} \times \frac{1}{\text{var}}\right) \le N_w$$

where $N_w$ represents the number of the second optical systems in the optical system group that have a shortest focal length among the plurality of optical systems, and floor(x) represents a floor function that gives a maximum integer not greater than a real number x.

3. The compound eye image pickup apparatus according to claim 2, wherein the number $N_w$ is greater than the number $N_t$ when the number of the plurality of optical systems is not an integral multiple of the number var.

4. The compound eye image pickup apparatus according to claim 3, wherein a largest number of optical systems in the optical system group having an identical focal length among the plurality of optical systems is the number $N_w$.

5. The compound eye image pickup apparatus according to claim 1, wherein the plurality of optical systems include an optical system group of the first optical systems having the longest focal length.

6. The compound eye image pickup apparatus according to claim 1, wherein a smallest number of optical systems in the optical system group having an identical focal length among the plurality of optical systems is the number $N_t$.

7. The compound eye image pickup apparatus according to claim 1,
wherein the plurality of optical systems includes an optical system i having a specific focal length and an optical system h having a focal length longer than the specific focal length, and
a condition expression below is satisfied, $$Ni \ge Nh$$

where Ni represents the number of the optical systems i, and Nh represents the number of the optical systems h.

8. The compound eye image pickup apparatus according to claim 1, wherein the plurality of optical systems are arranged such that image circles of the plurality of optical systems are in touch with each other.

9. The compound eye image pickup apparatus according to claim 1, wherein the plurality of optical systems are arranged such that image circles of the plurality of optical systems are in touch with each other along at least one of sides of the image pickup element that are orthogonal to each other.

10. The compound eye image pickup apparatus according to claim 1, wherein the plurality of optical systems are arranged such that circles representing outer circumferences of the plurality of optical systems are in touch with each other when the circles representing the outer circumferences of the plurality of optical systems are larger than image circles of the plurality of optical systems.

11. The compound eye image pickup apparatus according to claim 1, wherein the plurality of optical systems are arranged such that circles representing outer circumferences of part of the plurality of optical systems are in touch with image circles of other part of the plurality of optical systems, when the circles representing the outer circumferences of the part of the optical systems are larger than image circles of the part of the optical systems.

12. The compound eye image pickup apparatus according to claim 1, wherein the plurality of optical systems are arranged such that part of image circles of the plurality of optical systems overlap each other along at least one of sides of the image pickup element that are orthogonal to each other, when the image circles of the plurality of optical systems are larger than outer circumferences of the plurality of optical systems.

13. The compound eye image pickup apparatus according to claim 1, further comprising a plurality of image pickup units each including the plurality of optical systems and the image pickup element.

14. The compound eye image pickup apparatus according to claim 1, wherein the plurality of optical systems are detachably mounted on an image pickup apparatus body including the image pickup element.

\* \* \* \* \*